(12) United States Patent
Hirano et al.

(10) Patent No.: US 8,736,067 B2
(45) Date of Patent: May 27, 2014

(54) SEMICONDUCTOR DEVICE HAVING A PAD

(75) Inventors: Hiroshige Hirano, Nara (JP); Yukitoshi Ota, Osaka (JP); Yutaka Itoh, Kyoto (JP)

(73) Assignee: Panasonic Corporation, Osaka (JP)

( * ) Notice: Subject to any disclaimer, the term of this patent is extended or adjusted under 35 U.S.C. 154(b) by 107 days.

(21) Appl. No.: 13/191,818

(22) Filed: Jul. 27, 2011

(65) Prior Publication Data
US 2012/0025394 A1 Feb. 2, 2012

(30) Foreign Application Priority Data
Aug. 2, 2010 (JP) .................................. 2010-173435

(51) Int. Cl.
*H01L 23/48* (2006.01)
*H01L 23/485* (2006.01)

(52) U.S. Cl.
USPC ....... 257/774; 257/758; 257/775; 257/E23.02

(58) Field of Classification Search
USPC ........... 257/774, E23.011, E23.142, E23.151, 257/E23.152, 758, 775, 786, E23.02
See application file for complete search history.

(56) References Cited

U.S. PATENT DOCUMENTS

| 5,602,423 | A | | 2/1997 | Jain | |
|---|---|---|---|---|---|
| 5,736,791 | A | * | 4/1998 | Fujiki et al. | 257/781 |
| 5,986,343 | A | * | 11/1999 | Chittipeddi et al. | 257/758 |
| 6,313,540 | B1 | * | 11/2001 | Kida et al. | 257/784 |
| 6,362,528 | B2 | * | 3/2002 | Anand | 257/758 |
| 6,444,295 | B1 | * | 9/2002 | Peng et al. | 428/209 |
| 6,448,641 | B2 | * | 9/2002 | Ker et al. | 257/700 |
| 6,500,748 | B2 | | 12/2002 | Anand | |
| 6,531,384 | B1 | * | 3/2003 | Kobayashi et al. | 438/612 |
| 6,734,093 | B1 | * | 5/2004 | Sabin et al. | 438/614 |
| 6,746,951 | B2 | * | 6/2004 | Liu et al. | 438/627 |
| 6,847,124 | B2 | * | 1/2005 | Semi | 257/786 |
| 6,897,570 | B2 | * | 5/2005 | Nakajima et al. | 257/786 |
| 7,023,067 | B2 | * | 4/2006 | Allman et al. | 257/459 |
| 7,202,565 | B2 | * | 4/2007 | Matsuura et al. | 257/758 |
| 7,315,072 | B2 | * | 1/2008 | Watanabe | 257/503 |
| 2001/0013657 | A1 | | 8/2001 | Anand | |
| 2001/0027008 | A1 | | 10/2001 | Matsumoto | |
| 2002/0005583 | A1 | | 1/2002 | Harada et al. | |
| 2002/0039801 | A1 | | 4/2002 | Ishii | |
| 2003/0080428 | A1 | | 5/2003 | Izumitani et al. | |
| 2003/0178644 | A1 | | 9/2003 | Lee et al. | |
| 2003/0222351 | A1 | | 12/2003 | Aritoku | |
| 2006/0097396 | A1 | | 5/2006 | Kamiyama et al. | |

(Continued)

FOREIGN PATENT DOCUMENTS

| JP | 10-64938 | 3/1998 |
|---|---|---|
| JP | 10-229085 A | 8/1998 |
| JP | 2003-142485 | 5/2003 |

*Primary Examiner* — Steven J Fulk
*Assistant Examiner* — Eric Ward
(74) *Attorney, Agent, or Firm* — McDermott Will & Emery LLP

(57) ABSTRACT

A semiconductor device includes: a first insulating film formed on a substrate; a pad embedded in the first insulating film; and a second insulating film that is formed on the first insulating film and has an opening exposing at least part of the pad. The pad includes a plurality of pad interconnects, and an interconnect link is provided to electrically connect adjacent interconnects among the plurality of pad interconnects. The width of the pad interconnects is smaller than the height of the pad interconnects and larger than the width of the interconnect link.

21 Claims, 16 Drawing Sheets

(56) References Cited

U.S. PATENT DOCUMENTS

2009/0102059 A1* 4/2009 Ishii ............................... 257/774
2010/0090353 A1* 4/2010 Chi ............................... 257/782
2010/0096760 A1 4/2010 Yu et al.

* cited by examiner the disclosure of which including the specification, the drawings, and the claims is hereby incorporated by reference in its entirety.

US 8,736,067 B2

SEMICONDUCTOR DEVICE HAVING A PAD

CROSS-REFERENCE TO RELATED APPLICATION

This application claims priority to Japanese Patent Application No. 2010-173435 filed on Aug. 2, 2010, the disclosure of which including the specification, the drawings, and the claims is hereby incorporated by reference in its entirety.

BACKGROUND

The present disclosure relates to a semiconductor device, and more particularly to a semiconductor device having an embedded pad structure.

Along with the miniaturization of semiconductor devices, the damascene process has been increasingly used for formation of interconnect structures.

FIG. 13A is a plan view of a semiconductor device of the first conventional example, and FIG. 13B is a cross-sectional view taken along line A-A in FIG. 13A.

As shown in FIGS. 13A and 13B, insulating layers 18, 26, and 27 are formed sequentially on a semiconductor substrate (not shown). A bonding pad 21 is embedded in the insulating layer 27 with a barrier metal 20a interposed between the bonding bad 21 and the insulating layer 27. Although illustration is omitted, an uppermost interconnect electrically connected to the bonding pad 21 is formed in the insulating layer 27, and a via is formed in the insulating layers 18 and 26 for connection between the uppermost interconnect and a lower interconnect. An insulating layer 22 is formed on the insulating layer 27 and the bonding pad 21. The insulating layer 22 has an opening 23 to expose the top surface of the bonding pad 21.

A chemical mechanical polishing (CMP) technique is used for formation of the bonding pad 21 in the damascene process. However, using the CMP technique, the bonding pad 21 tends to be etched excessively at its center, as shown in FIG. 13B, causing dishing where the bonding pad 21 is dented like a dish.

FIGS. 14A and 14B show how the dishing occurs in the semiconductor device of the first conventional example. As shown in FIG. 14A, after formation of a groove 19b in the insulating layer 27, the barrier metal 20a is formed on the insulating layer 27 to cover the walls and bottom of the groove 19b, and thereafter a metal film 21' is formed on the barrier metal 20a to fill the groove 19b. Thereafter, as shown in FIG. 14B, portions of the metal film 21' and barrier metal 20a existing outside the groove 19b are removed by CMP. During this removal by CMP, the metal film 21' is etched, not only mechanically, but also chemically. Therefore, when the bonding pad 21 having a size of about 100 μm×100 μm is to be formed by leaving the portion of the metal film 21' in the groove 19b unremoved, the center of the portion of the metal film 21' in the groove 19b tends to be etched excessively by chemical etching mainly, causing dishing.

In view of the above problem, a technique of forming a pad structure using the damascene process while preventing occurrence of dishing is proposed (see Japanese Unexamined Patent Application Publication No. H10-64938).

FIG. 15A is a plan view of a semiconductor device of the second conventional example disclosed in Japanese Unexamined Patent Application Publication No. H10-64938, and FIG. 15B is a cross-sectional view taken along line A-A in FIG. 15A.

As shown in FIGS. 15A and 15B, insulating layers 18, 26, and 27 are formed sequentially on a semiconductor substrate (not shown). A bonding pad 21 is embedded in the insulating layer 27 with a barrier metal 20a interposed between the bonding bad 21 and the insulating layer 27. The bonding pad 21 in this example has a lattice shape for prevention of dishing during CMP. Although illustration is omitted, an uppermost interconnect electrically connected to the bonding pad 21 is formed in the insulating layer 27, and a via is formed in the insulating layers 18 and 26 for connection between the uppermost interconnect and a lower interconnect. An etching stopper layer 29 and an insulating layer (passivation layer) 22 are formed on the insulating layer 27 and the bonding pad 21. The etching stopper layer 29 is made of a material that allows selective etching against the materials of the insulating layer 27 and the passivation layer 22. The etching stopper layer 29 and the passivation layer 22 have an opening 23 to expose the top surface of the bonding pad 21.

In the semiconductor device of the second conventional example shown in FIGS. 15A and 15B, which has the lattice-shaped bonding pad 21, no excessive etching occurs in any portion of the bonding pad 21 formed using the CMP technique. Thus, dishing can be effectively prevented.

SUMMARY

The second conventional example described above has the following problem. FIGS. 16A and 16B are views illustrating the problem of the second conventional example, which respectively correspond to cross sections taken along line A-A and line B-B in FIG. 15A.

As shown in FIGS. 16A and 16B, after formation of a lattice-shaped groove 19b in the insulating film 27, the barrier metal 20a is formed on the insulating film 27 to cover the walls and bottom of the lattice-shaped groove 19b, and thereafter a metal film 21' that is to be the bonding pad 21 is formed on the barrier metal 20a.

In the above formation, if the metal film 21' is deposited so that the groove 19b is just filled with the metal film 21' when viewed from the cross section in FIG. 16A, poor filling of the groove 19b with the metal film 21' will occur at intersections of strips of the lattice, the centers of the strips, etc. when viewed from the cross section in FIG. 16B.

Conversely, if the metal film 21' is deposited so that the groove 19b is completely filled with the metal film 21' when viewed from the cross section in FIG. 16B, there will arise another problem that portions of the metal film 21' deposited on the insulating film 27, etc. will be thickened, increasing the time required for CMP of the metal film 21'.

In view of the above, it is an objective of the present disclosure to form a pad structure free from dishing or poor filling stably in a short time.

To achieve the above objective, the semiconductor device of the present disclosure includes: a first insulating film formed on a substrate; a pad embedded in the first insulating film; and a second insulating film formed on the first insulating film, the second insulating film having an opening exposing at least part of the pad, wherein the pad includes a plurality of pad interconnects, an interconnect link is provided to electrically connect adjacent interconnects among the plurality of pad interconnects, and the width of the plurality of pad interconnects is smaller than the height of the plurality of pad interconnects and larger than the width of the interconnect link.

According to the semiconductor device of the present disclosure, in which the pad is constituted by a plurality of pad interconnects, the size of the individual pad interconnects can be set to be small compared with the size of the pad region. Therefore, during formation of the pad by CMP, the pad interconnects will have no excessively etched portion, and thus dishing can be effectively prevented.

Also, according to the semiconductor device of the present disclosure, the width of the pad interconnects (the dimension in the direction normal to the direction in which the pad interconnects run) is smaller than the height of the pad interconnects (the thickness of the conductive film that is to be the pad interconnects). In other words, the width of a groove to be filled with each of the pad interconnects is smaller than the depth of the groove. Therefore, in formation of the conductive film in the groove to form the pad interconnect, the groove can be filled with the conductive film if only the thickness of the conductive film deposited on the opposite walls of the groove is about a half of the pad interconnect width. Thus, since the thickness of the portion of the conductive film to be removed by CMP after filling of the groove can be reduced, the pad interconnects can be formed stably in a short time.

Moreover, according to the semiconductor device of the present disclosure, in which interconnect links are provided to electrically connect the adjacent pad interconnects, occurrence of variations in potential among the pad interconnects can be prevented. Since the width of the interconnect links (the dimension in the direction normal to the direction of connection between the adjacent pad interconnects) is set to be small compared with the width of the pad interconnects, it is possible to avoid the trouble, which occurs in the conventional lattice-shaped pad structure made of strips having the same width, that poor filling with the conductive film for the pad occurs at intersections of the strips. Note that it is unnecessary to provide the interconnect links when a conductive layer for electrical connection between the pad interconnects is formed on the pad.

In the semiconductor device of the present disclosure, the height of the plurality of pad interconnects may be 1.5 times to 5 times as large as the width of the plurality of pad interconnects. With this setting, the pad interconnect groove can be filled with a conductive film that is thin compared with the depth of the pad interconnect groove. Also, generation of a void and unevenness of the seed layer can be prevented, which may occur when the aspect ratio of the pad interconnect groove is excessively high.

In the semiconductor device of the present disclosure, the width of the interconnect link may be three quarters or less of the width of the plurality of pad interconnects. With this setting, occurrence of poor filling with the conductive film for the pad at the connection between the pad interconnect and the interconnect link can be avoided.

In the semiconductor device of the present disclosure, the spacing between the plurality of pad interconnects may be smaller than the width of the plurality of pad interconnects. With this setting, the proportion of the area of the pad interconnects in the pad region can be increased, and thus the resistance of the pad can be reduced. Specifically, the spacing between the plurality of pad interconnects may be three quarters or less of the width of the plurality of pad interconnects.

In the semiconductor device of the present disclosure, at least two interconnect links may be provided between the adjacent interconnects, and the spacing between the interconnect links may be two times or more as large as the width of the plurality of pad interconnects. With this setting, occurrence of poor filling with the conductive film for the pad at the connections between the pad interconnects and the interconnect links can be avoided.

In the semiconductor device of the present disclosure, when one interconnect link is provided between the adjacent interconnects at a position of one side of each of the interconnects, another interconnect link may not be provided at a position of the other side of the interconnect opposite to the position of the one interconnect link. With this arrangement, occurrence of poor filling with the conductive film for the pad at the connection between the pad interconnect and the interconnect link can be avoided.

In the semiconductor device of the present disclosure, the top surface of a portion of the first insulating film located in the opening may be at a level lower than the top surfaces of the plurality of pad interconnects. With this configuration, stable wire bonding can be performed for the pad constituted by a plurality of pad interconnects. In this case, the top surface of a portion of the first insulating film located in the opening may be at a level lower than the top surface of a portion of the first insulating film located outside the opening. In other words, in the etching for formation of the opening in the second insulating film, the portion of the first insulating film located in the opening may be over-etched.

In the semiconductor device of the present disclosure, at least part of sidewalls of the opening may stand on a center portion of one or more interconnects, among the plurality of pad interconnects, in the width direction. With this configuration, it is possible to avoid a trouble that an edge of the opening may be deviated slightly from the position on the pad interconnect due to lack of precision in photolithography, etc. and, as a result, a narrow slit that cannot be filled may be formed in a portion of the first insulating film between the edge of the opening and the pad interconnect. Thus, processing stability can be improved.

In the semiconductor device of the present disclosure, a conductive layer may be formed in the opening so as to be electrically connected to the part of the pad. With this configuration, electrical connection of the pad with the outside can be easily secured via the conductive layer. Also, by electrically connecting the adjacent pad interconnects via the conductive film, it is possible to prevent occurrence of variations in potential among the pad interconnects. It is also possible to relax a stress applied to elements such as transistors placed under the pad region during wire bonding, etc. In this case, the conductive layer may also be formed on a portion of the second insulating film surrounding the opening.

The semiconductor device of the present disclosure may further includes a circuit interconnect embedded in the first insulating film, and the width of the circuit interconnect may be smaller than the height of the circuit interconnect. With this configuration, the width of the groove to be filled with the circuit interconnect is smaller than the depth of the groove. Therefore, in formation of the conductive film in the groove to form the circuit interconnect, the groove can be filled with the conductive film if only the thickness of the conductive film deposited on the opposite walls of the groove is about a half of the width of the groove. Thus, since the thickness of the portion of the conductive film to be removed by CMP after filling of the groove can be reduced, the circuit interconnect can be formed stably in a short time. Note that the width of the circuit interconnect refers to the dimension in the direction normal to the direction in which the circuit interconnect runs, and the height of the circuit interconnect refers to the thickness of the conductive film that is to be the circuit interconnect. The pad and the circuit interconnect may be electrically connected to each other via another interconnect formed below the first insulating film, or the pad and the circuit interconnect may be electrically connected to each other by extending at least some of the plurality of pad interconnects to be connected to the circuit interconnect.

In the semiconductor device of the present disclosure, the plurality of pad interconnects each may have a stripe shape. With this configuration, a plurality of pad interconnects can be formed easily.

In the semiconductor device of the present disclosure, the plurality of pad interconnects each may have a loop shape. With this shape, the electrical resistance of the entire pad can be reduced, and the directional property of the resistance can be reduced. Also, with existence of the loop-shaped outermost pad interconnect, it is possible to draw an interconnect from the pad in every direction with low resistance. In other words, another interconnect may be drawn from the outermost interconnect among the plurality of pad interconnects. The loop shape may be an octagonal or circular loop shape. When the pad interconnects are in a shape closer to a circle (i.e., a shape having more corners), the bending of the pad interconnects is milder, and this improves the filling property of the pad interconnect grooves with the conductive film at bends (by plating, for example), permitting stable formation of the pad interconnects. Moreover, compared with square loop-shaped pad interconnects, the pad interconnects having about the same area can be arranged in a smaller pad region.

In the semiconductor device of the present disclosure, the plurality of pad interconnects each may have a corner at a position closer to the center of the opening and run from the corner toward the outside of the opening in two directions. With this configuration, lead interconnects can be connected to the pad interconnects from outside the pad region without the necessity of providing bends. Thus, since the width of the lead interconnects can be about the same as the width of the pad interconnects, the resistance of the lead interconnects can be reduced.

As described above, in this disclosure, a pad structure free from dishing or poor filling can be formed stably in a short time. Accordingly, the present disclosure is suitable for semiconductor devices, and more particularly for semiconductor devices having an embedded pad structure.

DETAILED DESCRIPTION (First Embodiment)

A semiconductor device of the first embodiment of the present disclosure will be described hereinafter with reference to the relevant drawings.

Figure 1A:
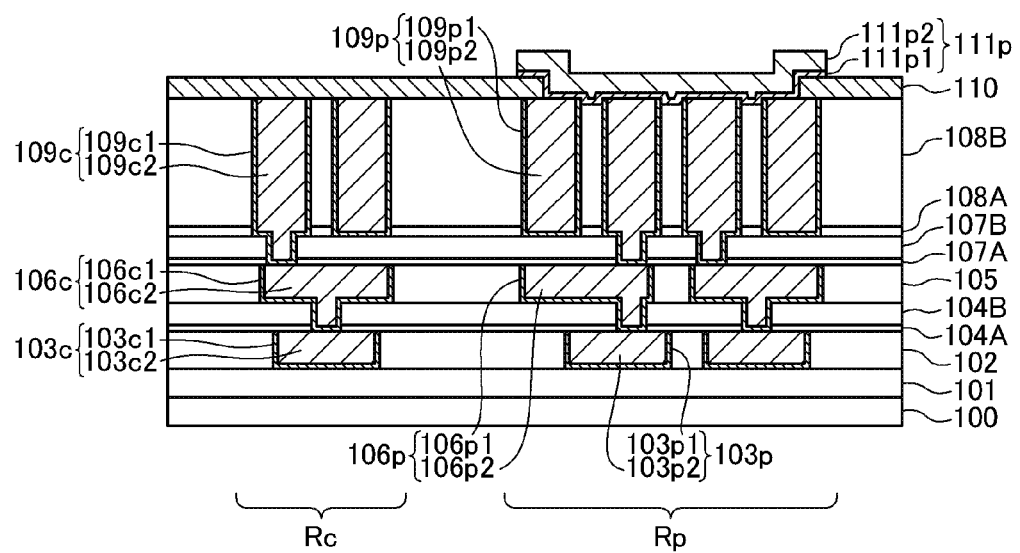
FIGS. 1A and 1B are a cross-sectional view and a plan view, respectively, of a semiconductor device of the first embodiment.
Figure 1B:
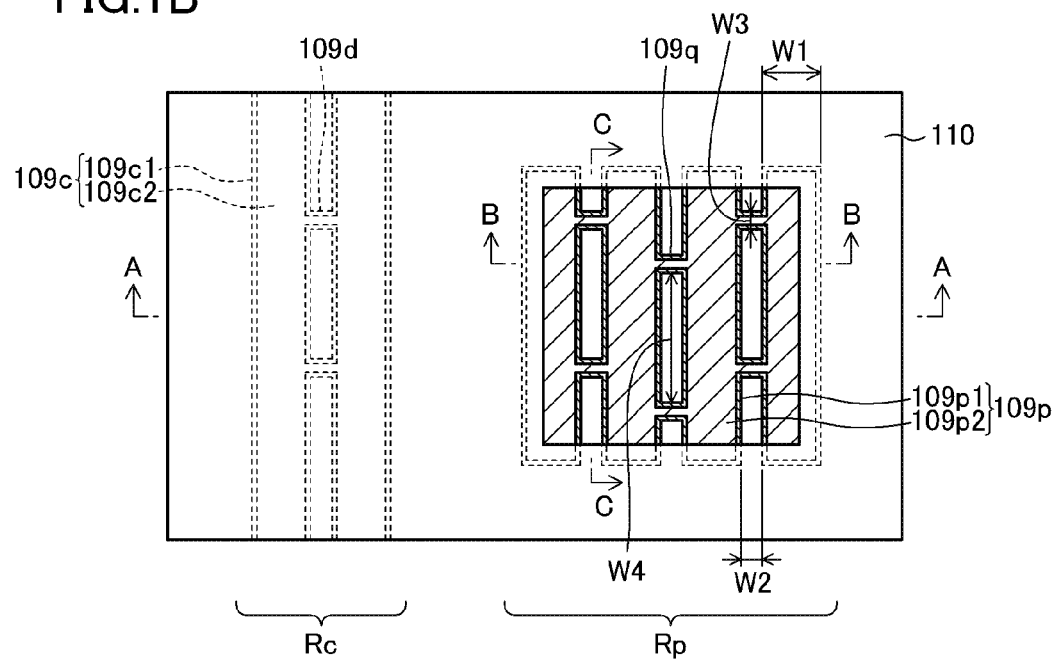
Figure 2A:
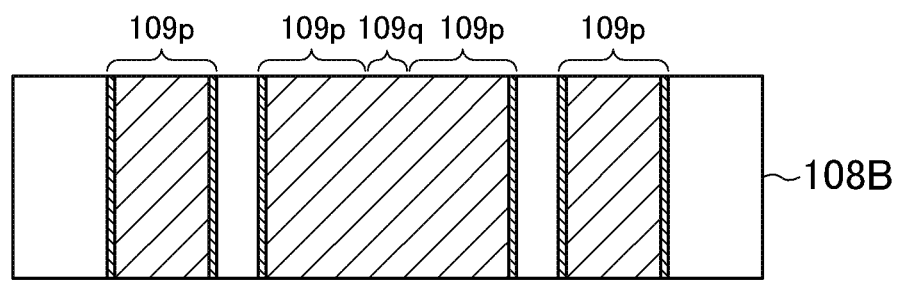
FIGS. 2A and 2B are views showing part of cross sections taken along line B-B and line C-C, respectively, in FIG. 1B.
Figure 2B:
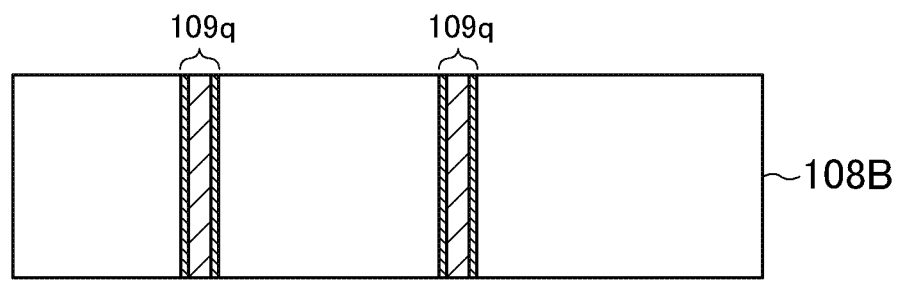

FIGS. 1A and 1B are a cross-sectional view and a plan view, respectively, of the semiconductor device of the first embodiment, where FIG. 1A corresponds to a cross section taken along line A-A in FIG. 1B. FIGS. 2A and 2B show part of cross sections taken along line B-B and line C-C, respectively, in FIG. 1B.

As shown in FIG. 1A, an insulating film 101 made of a tetraethylorthosilicate (TEOS) film, etc. having a thickness of about 150 nm, for example, and an insulating film 102 made of a fluorosilicate glass (fluorinated silicate glass) (FSG) film, a low dielectric constant (low-k) film, etc. having a thickness of about 150 nm, for example, are formed sequentially on a semiconductor substrate 100 having a circuit region Rc and a pad region Rp. An interconnect 103c is embedded in the insulating film 102 in the circuit region Rc. The interconnect 103c includes: a barrier metal 103c1 covering the walls and bottom of an interconnect groove formed in the insulating film 102; and a copper film 103c2 formed on the barrier metal 103c1 to fill the interconnect groove. Interconnects 103p are embedded in the insulating film 102 in the pad region Rp. The interconnects 103p each include: a barrier metal 103p1 covering the walls and bottom of an interconnect groove formed in the insulating film 102; and a copper film 103p2 formed on the barrier metal 103p1 to fill the interconnect groove. The barrier metals 103c1 and 103p1 each have a layered structure (thickness: about 20 to 50 nm) of a Ta film and a TaN film, for example.

Also referring to FIG. 1A, on the insulating film 102 including the interconnects 103c and 103p, formed sequentially are an insulating film 104A made of an SiN film, etc. having a thickness of about 50 nm, for example, an insulating film 104B made of a TEOS film, etc. having a thickness of about 250 nm, for example, and an insulating film 105 made of an FSG film, a low-k film, etc. having a thickness of about 250 nm, for example. An interconnect 106c is embedded in the insulating films 104A 104B, and 105 in the circuit region Rc. The interconnect 106c includes: a barrier metal 106c1 covering the walls and bottom of an interconnect groove of a dual-damascene structure formed in the insulating films 104A, 104B, 105; and a copper film 106c2 formed on the barrier metal 106c1 to fill the interconnect groove. The interconnect 106c has a via portion formed in the insulating films 104A and 104B to be electrically connected to the interconnect 103c via the via portion. Interconnects 106p are embedded in the insulating films 104A 104B, and 105 in the pad region Rp. The interconnects 106p each include: a barrier metal 106p1 covering the walls and bottom of an interconnect groove of a dual-damascene structure formed in the insulating films 104A, 104B, 105; and a copper film 106p2 formed on the barrier metal 106p1 to fill the interconnect groove. The interconnects 106p each have a via portion formed in the insulating films 104A and 104B to be electrically connected to the interconnect 103p via the via portion. The barrier metals 106c1 and 106p1 each have a layered structure (thickness: about 20 to 50 nm) of a Ta film and a TaN film, for example.

Still referring to FIG. 1A, on the insulating film 105 including the interconnects 106c and 106p, formed sequentially are an insulating film 107A made of an SiN film, etc. having a thickness of about 200 nm, for example, an insulating film 107B made of a TEOS film, etc. having a thickness of about 1 μm, for example, an insulating film 108A made of an SiN film, etc. having a thickness of 500 nm, for example, and an insulating film 108B made of a TEOS film, etc. having a thickness of about 5 μm, for example. A plurality of interconnects (hereinafter referred to as circuit interconnects) 109c are embedded in the insulating films 107A, 107B, 108A, and 108B in the circuit region Rc: i.e., the circuit interconnects 109c have a thick-film structure of about 5 μm or more. The circuit interconnects 109c each include: a barrier metal 109c1 covering the walls and bottom of an interconnect groove of a dual-damascene structure formed in the insulating films 107A, 107B, 108A, and 108B; and a copper film 109c2 formed on the barrier metal 109c1 to fill the interconnect groove. The circuit interconnects 109c each have a via portion formed in the insulating films 107A and 107B to be electrically connected to the interconnect 106c via the via portion. A plurality of interconnects (hereinafter referred to as pad interconnects) 109p are embedded in the insulating films 107A 107B, 108A, and 108B in the pad region Rp: i.e., the pad interconnects 109p have a thick-film structure of about 5 μm or more. In this embodiment, the plurality of pad interconnects 109p constitutes a pad for electrical connection with the outside. The pad interconnects 109p each include: a barrier metal 109p1 covering the walls and bottom of an interconnect groove of a dual-damascene structure formed in the insulating films 107A, 107B, 108A, and 108B; and a copper film 109p2 formed on the barrier metal 109p1 to fill the interconnect groove. The pad interconnects 109p each have a via portion formed in the insulating films 107A and 107B to be electrically connected to the interconnects 106p via the via portion. The barrier metals 109c1 and 109p1 each have a layered structure (thickness: about 20 to 50 nm) of a Ta film and a TaN film, for example.

As shown in FIGS. 1B, 2A, and 2B, interconnect links 109d are formed to connect the adjacent circuit interconnects 109c, and interconnect links 109q are formed to connect the adjacent pad interconnects 109p. The pad constituted by the pad interconnects 109p is electrically connected with the circuit interconnects 109c by connecting the interconnects 106c and 106p in the corresponding interconnect layer and/or by connecting the interconnects 103c and 103p in the corresponding interconnect layer.

As shown in FIGS. 1A and 1B, an insulating film 110 made of an SiN film, etc. having a thickness of about 200 to 500 nm, for example, is formed on the insulating film 108B including the circuit interconnects 109c and the pad interconnects 109p. The insulating film 110 has an opening formed to expose at least part of the pad constituted by the pad interconnects 109p, and a conductive layer 111p is formed in the opening to be electrically connected to the pad. The conductive layer 111p is also formed on a portion of the insulating film 110 surrounding the opening. The conductive layer 111p includes: a barrier metal 111p1 having a thickness of 100 to 300 nm, for example, covering the bottom and walls of the opening; and an aluminum film 111p2 having a thickness of about 0.5 to 2 μm, for example, formed on the barrier metal 111p1. The barrier metal 111p1 has a layered structure of a TiN film and a Ti film, for example. Note that illustration of the conductive film 111p is omitted in FIG. 1B.

As described above, in this embodiment, since the plurality of pad interconnects 109p constitute the pad, the size of the individual pad interconnects 109p can be set to be small compared with the size of the pad region. Therefore, in formation of the pad by CMP, the pad interconnects 109p will have no excessively etched portion, and thus dishing can be effectively prevented.

Also, in this embodiment, as shown in FIGS. 1A and 1B, the width W1 of the pad interconnects 109p (the dimension in the direction normal to the direction in which the pad interconnects 109p run) is set to be smaller than the height of the pad interconnects 109p (the thickness of a conductive film that is to be the pad interconnects 109p). In other words, the width of the grooves in which the pad interconnects 109p are formed is smaller than the depth of the grooves. Therefore, in formation of the conductive film in the grooves to form the pad interconnects 109p, the grooves can be filled with the conductive film if only the thickness of the conductive film deposited on the opposite walls of each groove is about a half of the pad interconnect width W1. Thus, since the thickness of a portion of the conductive film to be removed by CMP after formation of the pad interconnects 109p can be reduced, the pad interconnects 109p can be formed stably in a short time.

In this embodiment, in which the interconnect links 109q are provided to electrically connect the adjacent pad interconnects 109p, occurrence of variations in potential among the pad interconnects 109p can be prevented. Since the width W3 of the interconnect links 109q (the dimension in the direction normal to the direction of connection between the adjacent pad interconnects 109p) is set to be small compared with the width W1 of the pad interconnects 109p, it is possible to avoid the trouble, which arises in the conventional lattice-shaped pad structure made of strips having the same width, that poor filling with the conductive film for the pad occurs at intersections of strips of the lattice.

Note that when the conductive layer 111p is formed for electrical connection between the pad interconnects 109p as in this embodiment, it is unnecessary to provide the interconnect links 109q because occurrence of variations in potential among the pad interconnects can be prevented by the conductive layer 111p.

A method for manufacturing the semiconductor device of the first embodiment of the present disclosure will be described hereinafter with reference to the relevant drawings.

Figure 3A:
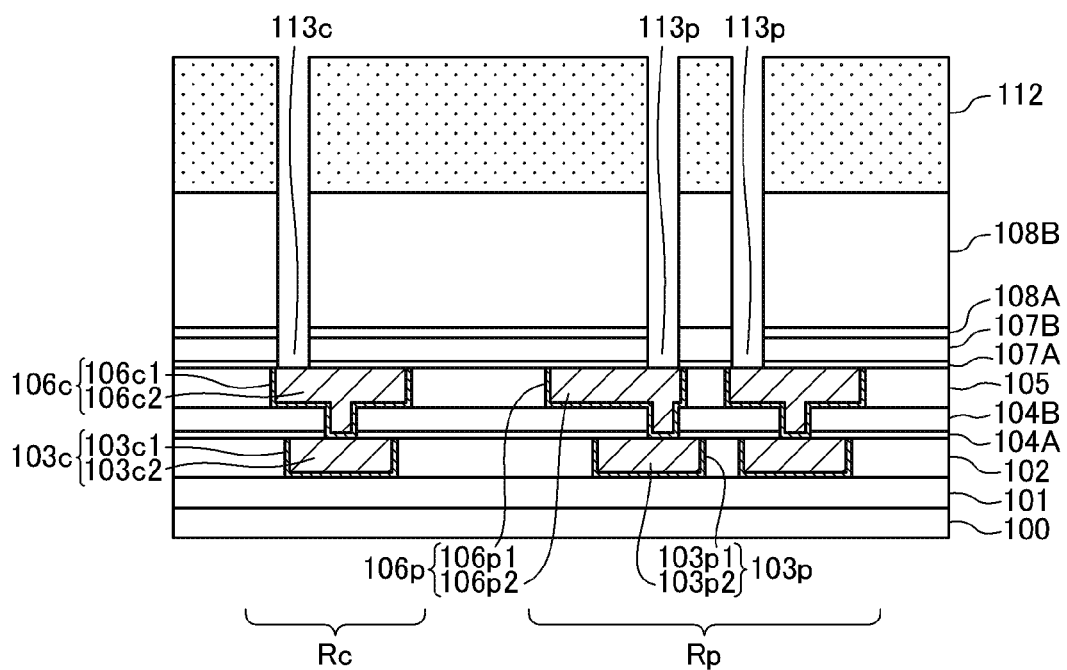
FIGS. 3A and 3B are a cross-sectional view and a plan view, respectively, showing a step of a method for manufacturing the semiconductor device of the first embodiment.
Figure 3B:
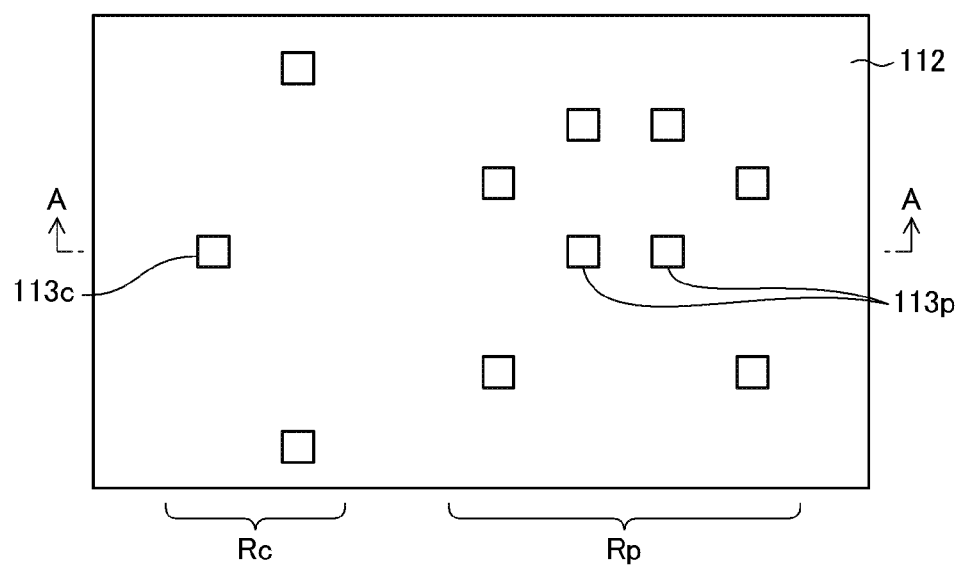
Figure 4A:
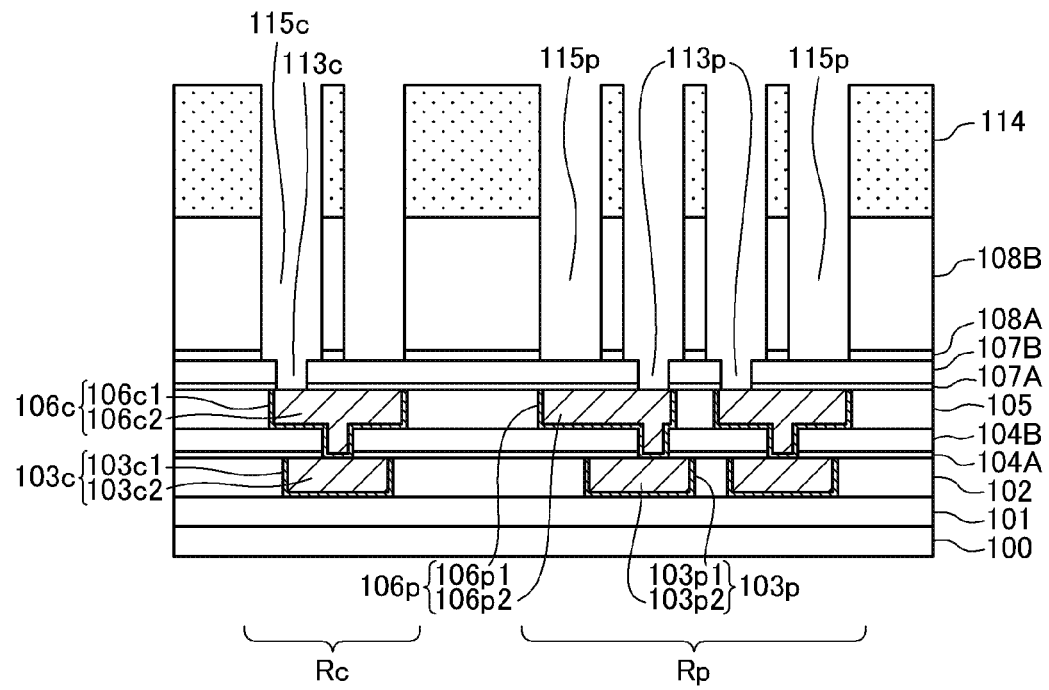
FIGS. 4A and 4B are a cross-sectional view and a plan view, respectively, showing a step of the method for manufacturing the semiconductor device of the first embodiment.
Figure 4B:
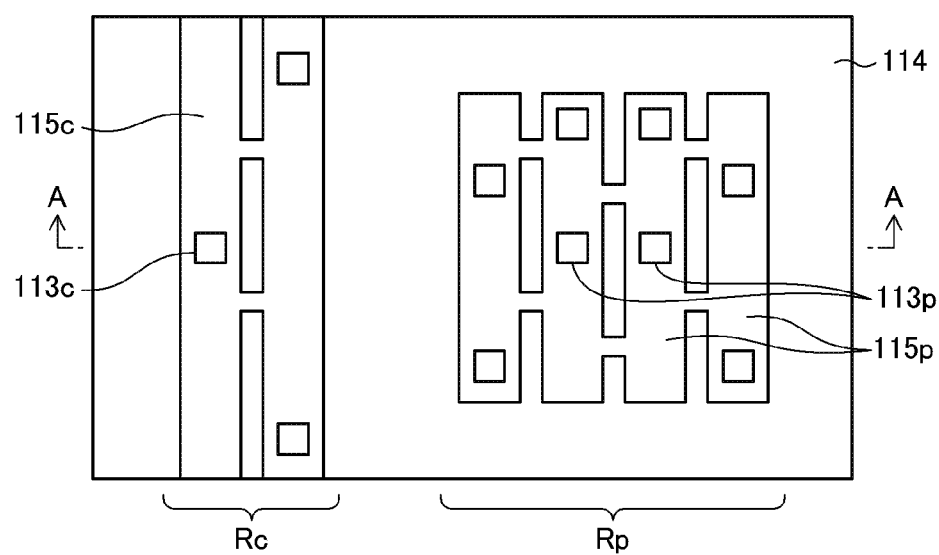
Figure 5A:
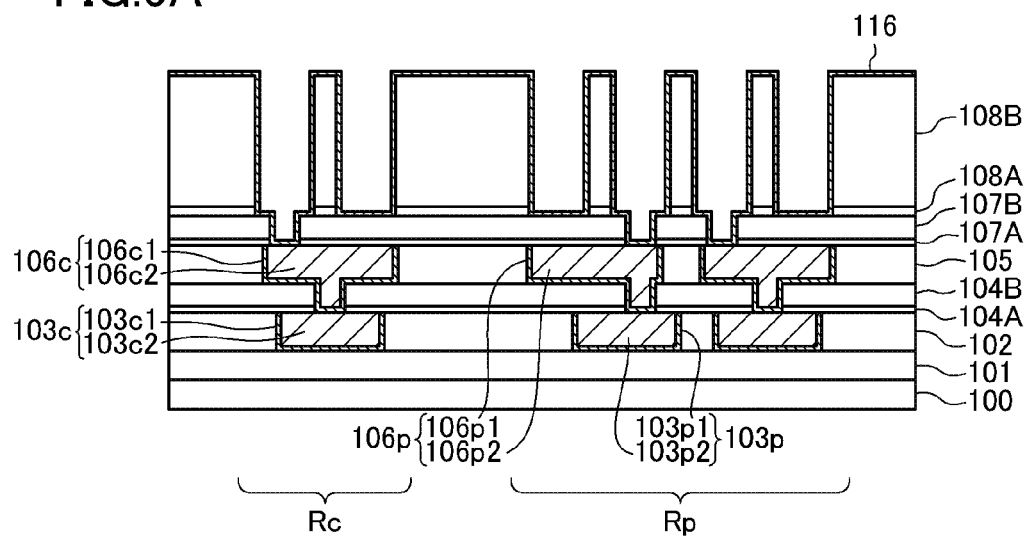
FIGS. 5A and 5B are cross-sectional views showing steps of the method for manufacturing the semiconductor device of the first embodiment.
Figure 5B:
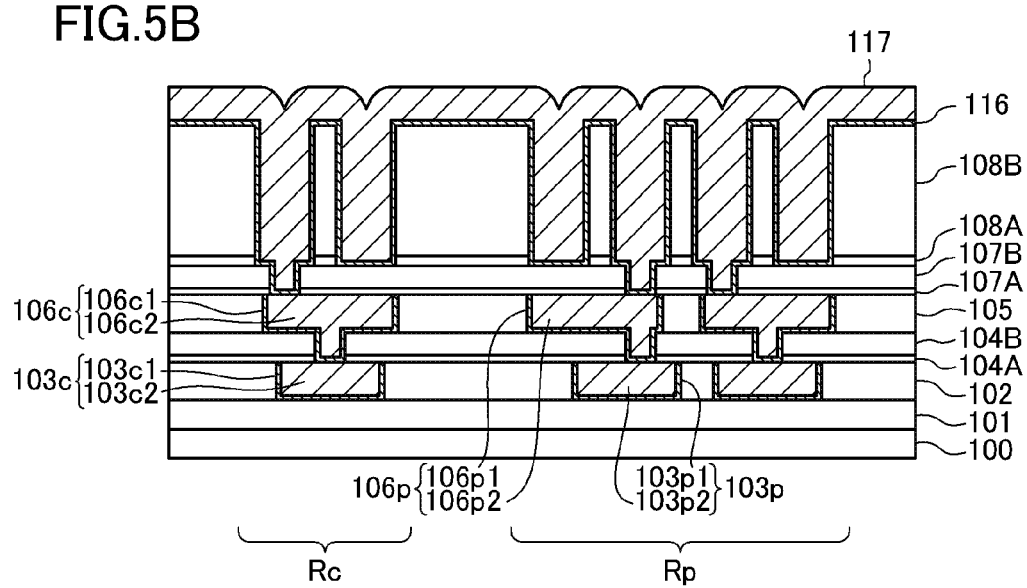
Figure 6A:
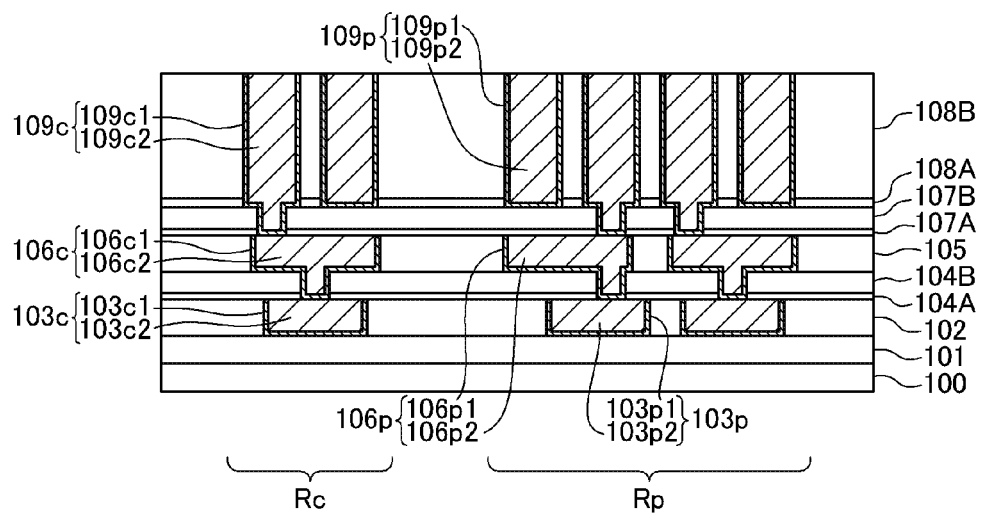
FIGS. 6A and 6B are a cross-sectional view and a plan view, respectively, showing a step of the method for manufacturing the semiconductor device of the first embodiment.
Figure 6B:
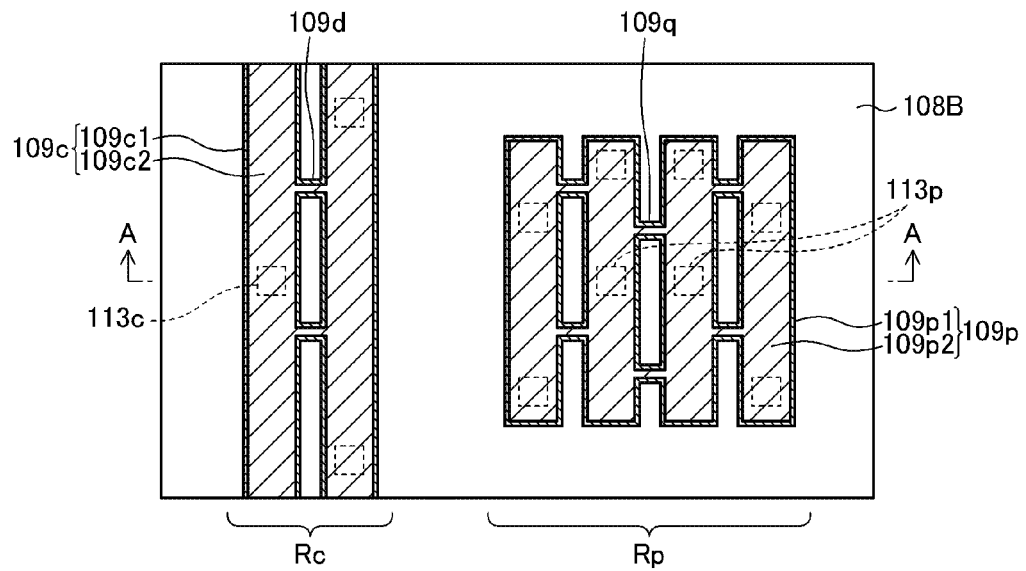

FIGS. 3A, 4A, 5A, 5B, and 6A are cross-sectional views showing steps of the method for manufacturing the semiconductor device of the first embodiment, and FIGS. 3B, 4B, and 6B are plan views showing the corresponding steps of the method, where FIG. 3A shows a cross section taken along line A-A in FIG. 3B, FIG. 4A shows a cross section taken along line A-A in FIG. 4B, and FIG. 6A shows a cross section taken along line A-A in FIG. 6B.

As shown in FIG. 3A, the insulating film 101 made of a TEOS film, etc., for example, and the insulating film 102 made of an FSG film, a low-k film, etc., for example, are formed sequentially on the semiconductor substrate 100 having the circuit region Rc and the pad region Rp. Thereafter, an interconnect groove is formed in the insulating film 102 in the circuit region Rc, and then the copper film 103c2 is filled in the interconnect groove with the barrier metal 103c1 interposed between the insulating film 102 and the copper film 103c2, to form the interconnect 103c. Also, interconnect grooves are formed in the insulating film 102 in the pad region Rp, and then the copper film 103p2 is filled in the interconnect grooves with the barrier metal 103p1 interposed between the insulating film 102 and the copper film 103p2, to form the interconnects 103p. Photolithography and etching are used for formation of the interconnect grooves in the insulating film 102. The copper films 103c2 and 103p2 are formed in the following manner: after a seed layer is formed subsequent to formation of the barrier metal, a copper film is formed on the entire surface of the insulating film 102 including the interconnect grooves by electrolytic plating, for example, and then an unnecessary portion of the copper film is removed by CMP, for example.

Thereafter, as shown in FIG. 3A, the insulating film 104A made of an SiN film, etc., for example, the insulating film 104B made of a TEOS film, etc., for example, and the insulating film 105 made of an FSG film, a low-k film, etc., for example, are sequentially formed on the insulating film 102 including the interconnects 103c and 103p. An interconnect groove of a dual-damascene structure is then formed in the insulating films 104A, 104B, 105 in the circuit region Rc, and then the copper film 106c2 is filled in the interconnect groove with the barrier metal 106c1 interposed between the insulating films 104A, 104B, 105 and the copper film 106c2, to form the interconnect 106c. Similarly, interconnect grooves of a dual-damascene structure are formed in the insulating films 104A, 104B, 105 in the pad region Rp, and then the copper film 106p2 is filled in the interconnect grooves with the barrier metal 106p1 interposed between the insulating films 104A, 104B, 105 and the copper film 106p2, to form the interconnects 106p. Photolithography and etching are performed twice each for formation of the interconnect grooves of the dual-damascene structure in the insulating films 104A, 104B, 105. The insulating film 104A made of an SiN film, etc. serves as an etching stopper on the top surfaces of the interconnects 103c and 103p. The copper films 106c2 and 106p2 are formed in the following manner: after a seed layer is formed subsequent to formation of the barrier metal, a copper film is formed on the entire surface of the insulating film 105 including the interconnect grooves by electrolytic plating, for example, and then an unnecessary portion of the copper film is removed by CMP, for example.

Thereafter, as shown in FIG. 3A, the insulating film 107A made of an SiN film, etc., for example, the insulating film 107B made of a TEOS film, etc., for example, the insulating film 108A made of an SiN film, etc., for example, and the insulating film 108B made of a TEOS film, etc., for example are formed sequentially on the insulating film 105 including the interconnects 106c and 106p. Subsequently, as shown in FIGS. 3A and 3B, a resist pattern 112 having openings corresponding to via formation regions is formed on the insulating film 108B. Using the resist pattern 112 as a mask, the insulating films 107A, 107B, 108A, and 108B are etched to form via holes 113c in the circuit region Rc and via holes 113p in the pad region Rp. The insulating film 107A made of an SiN film, etc. serves as an etching stopper on the top surfaces of the interconnects 106c and 106p.

After removal of the resist pattern 112, as shown in FIGS. 4A and 4B, a resist pattern 114 having openings corresponding to interconnect formation regions is formed on the insulating film 108B. Using the resist pattern 114 as a mask, the insulating films 108A and 108B are etched to form interconnect grooves 115c connected to the via holes 113c in the circuit region Rc and interconnect grooves 115p connected to the via holes 113p in the pad region Rp. The insulating film 108A made of an SiN film, etc. serves as an etching stopper on the top surface of the insulating film 107B made of a TEOS film.

Thereafter, as shown in FIG. 5A, a barrier metal 116 is formed on the entire surface of the insulating film 108B including the via holes 113c and 113p and the interconnect grooves 115c and 115p, and then a seed layer (not shown) is formed on the barrier metal 116. As shown in FIG. 5B, a copper film 117 is then formed on the seed layer by electrolytic plating, for example, to fill the via holes 113c and 113p and the interconnect grooves 115c and 115p.

As shown in FIGS. 6A and 6B, portions of the copper film 117 and the barrier metal 116 existing outside the interconnect grooves 115c and 115p are removed by CMP, for example, thereby to form the plurality of circuit interconnects 109c each including the barrier metal 109c1 and the copper film 109c2 in the circuit region Rc and the plurality of pad interconnects 109p each including the barrier metal 109p1 and the copper film 109p2 in the pad region Rp.

Thereafter, by forming the insulating film 110 having an opening that exposes at least part of the pad constituted by the pad interconnects 109p and the conductive layer 111p (layered structure of the barrier metal 111p1 and the aluminum film 111p2) electrically connected to the pad in the opening, the semiconductor device of this embodiment shown in FIGS. 1A and 1B can be implemented. For formation of the aluminum film 111p2, overall sputtering and patterning by photolithography and etching, for example, may be used.

In this embodiment, for use as low-resistance power supply interconnects, the circuit interconnects 109c have a thick-film structure of about 5 μm or more, for example, as do the pad interconnects 109p. If the width (W1 in FIG. 1B) of the circuit interconnects 109c and the pad interconnects 109p is made large, filling of the interconnect grooves will fail unless the deposition thickness of the conductive film (e.g., a plated film) that is to be the circuit interconnects 109c and the pad interconnects 109p is increased to about 5 μm or more that is the height of the circuit interconnects 109c and the pad interconnects 109p (the depth of the interconnect grooves). If the deposition thickness of the conductive film is made as large as about 5 μm or more, the conductive film will also be deposited on the insulating film 108B outside the interconnect grooves to about 5 μm or more naturally, and such a conductive film of about 5 μm or more on the insulating film 108B must be removed by CMP. This will not only increase the time required for plating and CMP, decreasing the efficiency, from the standpoint of the manufacturing process, but also make it difficult technically to perform CMP stably without leaving any film residue.

To overcome the problem described above, in this embodiment, the width W1 (see FIG. 1B) of the circuit interconnects 109c and the pad interconnects 109p is set to be smaller than the height of the circuit interconnects 109c and the pad interconnects 109p (the depth of the interconnect grooves). Specifically, the width W1 is set at about 3 μm, for example. With this setting, since plating grows from the opposite walls of each interconnect groove, the interconnect groove can be filled with the plated film theoretically if only the plated film thickness (deposition thickness) is about a half of the interconnect width (W1). Specifically, when the width W1 is about 3 μm, the interconnect groove can be filled with a deposition thickness of about 1.5 to 2.5 μm, which is about one-third to a half of the deposition thickness (about 5 μm or more) required for filling of the interconnect groove when the width W1 is large. With the interconnect structure in this embodiment as described above, although the interconnect grooves are deep, the circuit interconnects 109c and the pad interconnects 109p as thick-film interconnects can be formed without adversely affecting the conductive film formation process (e.g., plating process) and the CMP process, theoretically, as far as the aspect ratio and size of the interconnect grooves fall within their ranges permitting filling of the interconnect grooves with the conductive film by plating, for example.

In this embodiment, as described earlier, the pad for electrical connection with the outside is constituted by the stripe-shaped pad interconnects 109p running in parallel with each other, as shown in FIGS. 1A and 1B. The interconnect links 109q are provided for electrical connection between the adjacent pad interconnects 109p, thereby to prevent occurrence of variations in potential among the pad interconnects 109p. On the pad constituted by the pad interconnects 109p, formed is the insulating film 110 having an opening exposing at least part of the pad.

Figure 7:
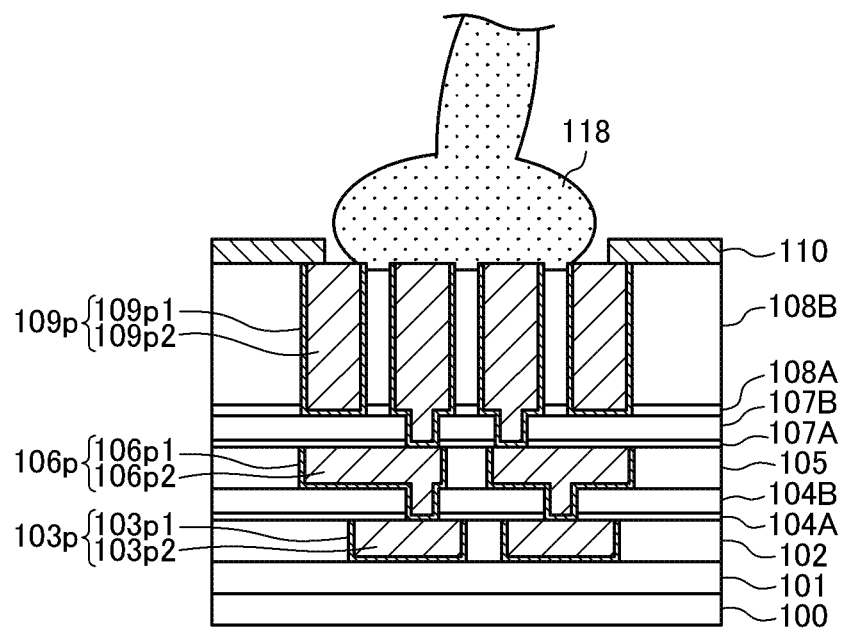
FIG. 7 is a cross-sectional view of a semiconductor device of a variation of the first embodiment.

That is, in this embodiment, the entire surface of the pad region is not occupied by the interconnect layer. In other words, portions of the insulating film 108B having the pad interconnects 109p embedded therein (portions of the insulating film 108B existing between the adjacent pad interconnects 109p) are exposed in the opening of the insulating film 110. During etching for formation of the opening of the insulating film 110, the surfaces of the portions of the insulating film 108B located in the opening are removed a little (e.g., by about 0.05 to 0.2 μm) by over-etching. As a result, as shown in FIG. 1A, the top surfaces of the portions of the insulating film 108B exposed in the opening are at a level lower than the top surfaces of the pad interconnects 109p and the top surface of the portion of the insulating film 108B located outside the opening. In other words, the tops of the pad interconnects 109p protrude in the opening of the insulating film 110. Therefore, when a bonding wire 118 is directly formed in the opening of the insulating film 110, as shown in FIG. 7, for example, to be connected with at least part of the pad constituted by the pad interconnects 109p without formation of the conductive layer 111p in the opening, application of ultrasonic wave to the pad interconnects 109p is ensured, permitting stable wire bonding.

In this embodiment, it is preferable that the sidewalls (edges) of the opening of the insulating film 110 in the direction of running of the stripe-shaped pad interconnects 109p stand on center portions of the pad interconnects 109p in the width direction. By this placement, it is possible to avoid a trouble that an edge of the opening may be deviated slightly from the position on the pad interconnect 109p due to lack of precision in photolithography, etc. and, as a result, a narrow slit that cannot be filled may be formed in a portion of the insulating film 108B between the edge of the opening and the pad interconnect 109p. Thus, processing stability can be improved.

Although arrangement of four stripe-shaped pad interconnects 109p is shown in FIGS. 1A and 1B, it is actually possible to arrange about 20 pad interconnects 109p having a width W1 of about 3 μm, for example, for a pad region having a size of 100 μm☐ (100 μm×100 μm), for example. A denser arrangement of the pad interconnects 109p in the pad region can more reduce the resistance of the pad and improve the reliability of the wire bonding. Therefore, the pad interconnects 109p may be arranged as densely as possible if only a thick-film resist can be formed without collapsing during patterning. For example, it is possible to arrange about 20 pad interconnects 109p having a width W1 of about 3 μm, for example, at interconnect spacing W2 (see FIG. 1B) of about 1.5 to 2 μm, for example, in a pad region of 100 μm☐, for example. Via portions for connection to the underlying interconnects 106p are provided for all or some of the pad interconnects 109p depending on the device.

When the pad is constituted by a plurality of pad interconnects 109p whose height (the depth of the interconnect grooves) is larger than the width W1, as in this embodiment, the pad can be formed together with the thick-film circuit interconnects 109c. In other words, the thick-film pad interconnects 109p can be formed simultaneously with the thick-film circuit interconnects 109c without the necessity of newly providing a pad formation process. The pad constituted by the thick-film pad interconnects 109p has a property of relaxing a stress applied to the pad during wire bonding, probe testing, etc., and thus can relax a stress acting on the interconnects and elements such as transistors (not shown) placed under the pad. Also, in this embodiment, with the conductive layer 111p formed in the opening of the insulating film 110 located above the pad constituted by the pad interconnects 109, electrical connection between the pad and the outside can be easily attained via the conductive layer 111p, and also the stress relaxing effect can be further increased.

Although the pad interconnects 109p are stripe-shaped in this embodiment, the shape of the pad interconnects 109p is not specifically limited. However, it is easy to form the pad interconnects 109p in a stripe shape.

Although copper is used as the material of the interconnects such as the pad interconnects 109p and the circuit interconnects 109c in this embodiment, the interconnect material is not specifically limited as far as it is a conductive material allowing plating and CMP. For example, gold, palladium, etc. may be used.

In this embodiment, the aluminum film 111p2 is formed on the pad as the conductive layer 111p by sputtering. Alternatively, after formation of a seed layer on the entire surface of the substrate and then resist patterning, a conductive layer made of copper, nickel, gold, solder, etc. may be formed in only a resist opening (located above the pad) by electrolytic plating. In this case, although the thickness of the conductive layer is not specifically limited, it may be several micrometers or more, for example, when a metal other than solder is used, and 10 μm or more, for example, when solder is used. Otherwise, when it is intended to manufacture a semiconductor device for flip bonding in consideration of the assembly (mounting), a solder ball, etc. may be formed on the pad in place of the conductive layer 111p.

In this embodiment, an FSG film or a low-k film is used as the insulating films 102 and 105. Alternatively, a layered film of an FSG film or a low-k film as a lower layer and a TEOS film as an upper layer may be used.

In this embodiment, a layered film of a Ta film and a TaN film is used as the barrier metals 103c1, 103p1, 106c1, 106p1, 109c1, and 109p1. Alternatively, a TiN film, for example, may be used.

In this embodiment, an SiN film, etc. may be formed, as an etching stopper, between the insulating film 104B made of a TEOS film, etc. and the insulating film 105 made of an FSG film, a low-k film, etc. Note however that there is a merit of low capacitance when such an SiN film is not formed.

In this embodiment, an SiN film is formed as the insulating film 110. Alternatively, a layered film of an SiN film as a lower layer and a TEOS film as an upper layer may be formed.

In this embodiment, a layered film of a TiN film and a Ti film is used as the barrier metal 111p. Alternatively, a TiN film, for example, may be used.

Figure 8A:
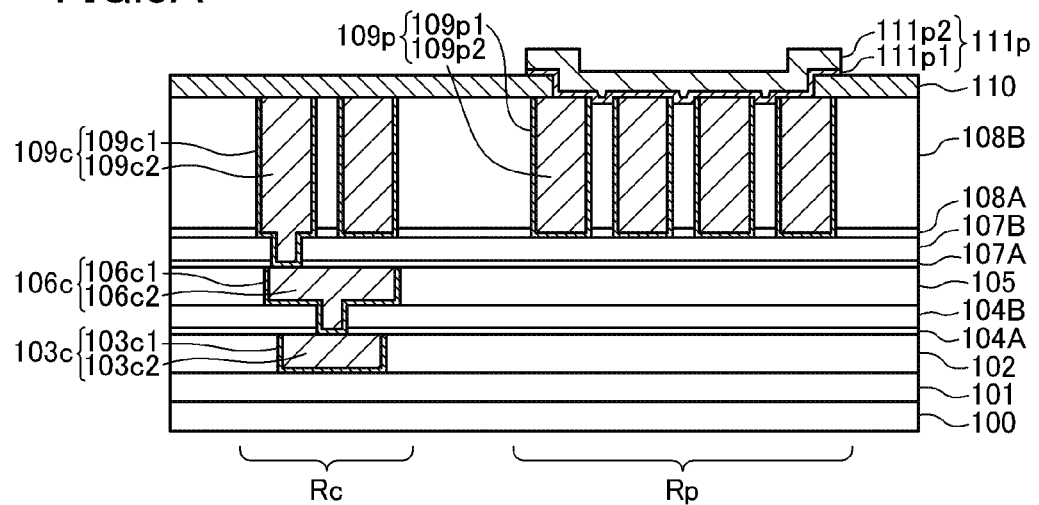
FIGS. 8A and 8B are a cross-sectional view and a plan view, respectively, of a semiconductor device of another variation of the first embodiment.
Figure 8B:
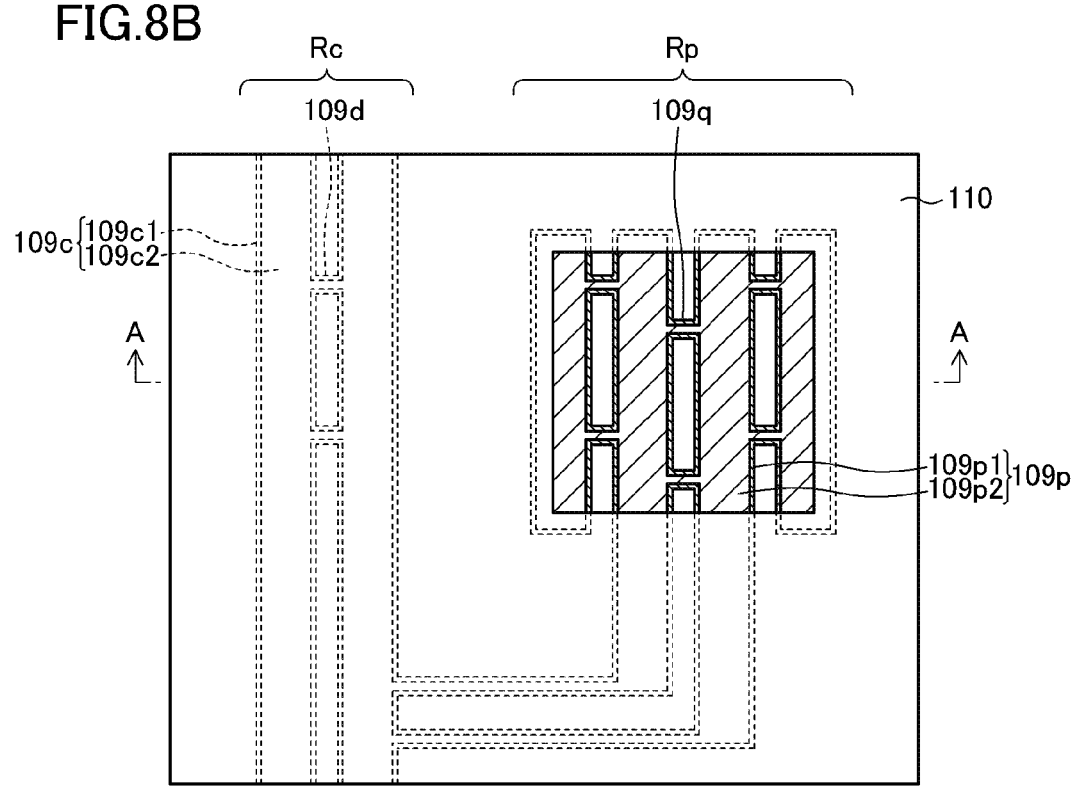

In this embodiment, by providing the thick-film pad interconnects 109p in the same interconnect layer as the thick-film circuit interconnects 109c, the advantages of the this embodiment described above related to the thick-film pad interconnects 109p can be obtained without the necessity of using another process for formation of the pad, unlike the conventional case, and also the power supply voltage applied to the circuit region Rc can be strengthened. In relation to this, in this embodiment, the pad constituted by the pad interconnects 109p are electrically connected with the circuit interconnects 109c via an interconnect layer underlying the interconnect layer including these interconnects. Alternatively, as shown in FIGS. 8A and 8B, no interconnects may be formed under the pad interconnects 109p in the pad region Rp, but at least some of the plurality of pad interconnects 109p may be extended up to the circuit region Rc to be connected to a circuit interconnect 109c, thereby to establish electrical connection between the pad and the circuit interconnects 109c. With this configuration, the pad and the circuit interconnects 109c can be connected with lower resistance. In this case, to prevent poor filling at bends of the interconnects, it is preferable that the width of portions of the extensions of the pad interconnects 109p running in a direction different from the direction of running of the pad interconnects 109p in the pad region may be made smaller than the width W1 (see FIG. 1B) of the pad interconnects 109p in the pad region.

In this embodiment, the width W1 (see FIG. 1B) of the pad interconnects 109p is set to be smaller than the height of the pad interconnects 109p (the thickness of the conductive film that is to be the pad interconnects 109p). The height of the pad interconnects 109p may be about 1.5 times to about 5 times as large as the width W1 of the pad interconnects 109p. With the pad interconnects 109p having a height about 1.5 times or more as large as the width W1 of the pad interconnects 109p, the pad interconnect grooves can be filled with a conductive film that is thin compared with the depth of the pad interconnect grooves as described above. With the pad interconnects 109p having a height about 5 times or less as large as the width W1 of the pad interconnects 109p, generation of a void and unevenness of the seed layer can be prevented, which may occur when the aspect ratio of the pad interconnect grooves is excessively high.

In this embodiment, as shown in FIG. 1B, for example, the width W1 of the pad interconnects 109p is fixed, and the spacing W2 between the adjacent pad interconnects 109p is set to be small compared with the width W1. This can increase the proportion of the area (i.e., volume) of the pad interconnects 109p in the pad region and thus reduce the resistance of the pad. To obtain this advantage reliably, the spacing W2 should preferably be set at three quarters or less of the width W1 of the pad interconnects 109p, and more preferably at a half or less of the width W1. For example, the proportion of the area described above can be about 60 to 75% by setting the width W1 of the stripe-shaped pad interconnects 109p at about 3 μm and the interconnect spacing W2 at about 1 to 2 μm.

In this embodiment, as shown in FIG. 1B, for example, the width W3 of the interconnect links 109q is set to be small compared with the width W1 of the pad interconnects 109p. The reason for this is as follows. If the width W3 of the interconnect links 109q is about the same as the width W1 of the pad interconnects 109p, poor filling is likely to occur at the connections between the pad interconnects 109p and the interconnect links 109q. To avoid this poor filling, if the deposition thickness, e.g., the plating thickness, of the conductive film is made large in formation of the interconnects, the plating workability and the plating efficiency, for example, will deteriorate, and also the time required for post-plating CMP will increase. In this embodiment, by making the width W3 of the interconnect links 109q smaller than the width W1 of the pad interconnects 109p, it is possible to obtain a structure in which the adjacent pad interconnects 109p are electrically connected via the interconnect links 109q without causing the problem described above. To obtain such a structure reliably without causing the above problem, the width W3 of the interconnect links 109q should preferably be set at three quarters of or less of the width W1 of the pad interconnects 109p, and more preferably at a half or less of the width W1.

In this embodiment, when a plurality of interconnect links 109q are provided between any two adjacent pad interconnects 109p as shown in FIG. 1B, for example, the spacing W4 between the adjacent interconnect links 109q should preferably be set to be twice or more as large as the width W1 of the pad interconnects 109p, and more preferably to be three times or more as large as the width W1, for prevention of occurrence of poor filling as described above.

In this embodiment, in order to prevent occurrence of poor filling as described above, it is preferable that, when an interconnect link 109q is provided at a position of one side of a pad interconnect 109p, no interconnect link is provided at a position of the other side of the pad interconnect 109p opposite to the position at which the interconnect link 109q is provided, as shown in FIG. 1B, for example.

In this embodiment, the size of the vias (via holes 113p (see FIG. 6B)) for connecting the pad interconnects 109p to the underlying interconnects 106p is not specifically limited. However, when the width W1 of the pad interconnects 109p is about 3 μm, for example, the size of the vias may be set at about 2.5 μm that is a little smaller than the width W1. When a plurality of vias are provided for one pad interconnect 109p, the spacing between the adjacent vias should preferably be set to be twice or more as large as the width W1 of the pad interconnects 109p, and more preferably to be three times or more as large as the width W1 (e.g., about 10 μm or more when W1 is about 3 μm), for prevention of occurrence of poor filling as described above.

In the above description, preferred ranges of the height of the pad interconnects 109p, the spacing W2 between the adjacent pad interconnects 109p, the width W3 of the interconnect links 109q, the spacing W4 between the adjacent interconnect links 109q, and the spacing between the adjacent vias are presented in conjunction with the width W1 of the pad interconnects 109p. This also applies to the preferred ranges of the height of the circuit interconnects 109c, the spacing between the adjacent circuit interconnects 109c, the width of the interconnect links 109d, the spacing between the adjacent interconnect links 109d, and the spacing between the adjacent vias, which can be presented in conjunction with the width of the circuit interconnects 109c.

In this embodiment, interconnects substantially constituting circuits are intended to be the circuit interconnects 109c. Actually, however, dummy interconnects are generally formed in a region where no circuit interconnect exists, to secure the CMP uniformity over the conductive film for interconnects. Therefore, in this embodiment, dummy interconnects may be formed in a region other than the circuit region Rc and the pad region Rp. The shape of such dummy interconnects may be dot-like or rectangular. In this embodiment, since the circuit interconnects 109c and the pad interconnects 109p have a thin-film structure, the dummy interconnects are also to have a thin-film structure. In this case, when rectangular, or stripe-shaped dummy interconnects are formed, stress is likely to be generated in such dummy interconnects, as well as the stripe-shaped circuit interconnects 109c, due to contraction of the interconnects caused by disappearance of depletion portions by heat treatment. It is therefore preferable to form dot-like dummy interconnects. As for the stripe-shaped circuit interconnects 109c, it is preferable, from the standpoint of the manufacturing process, to set so that circuit interconnects 109c running in one direction and circuit interconnects 109c running in a direction normal to the one direction exist in about the same proportion, or to limit the length of circuit interconnects 109c running in the same direction. As a result, it is possible to obtain another advantage of relaxing a stress that may cause wafer warping, etc.

Other advantages obtained by the pad structure in this embodiment shown in FIGS. 1A and 1B will be described.

Figure 9:
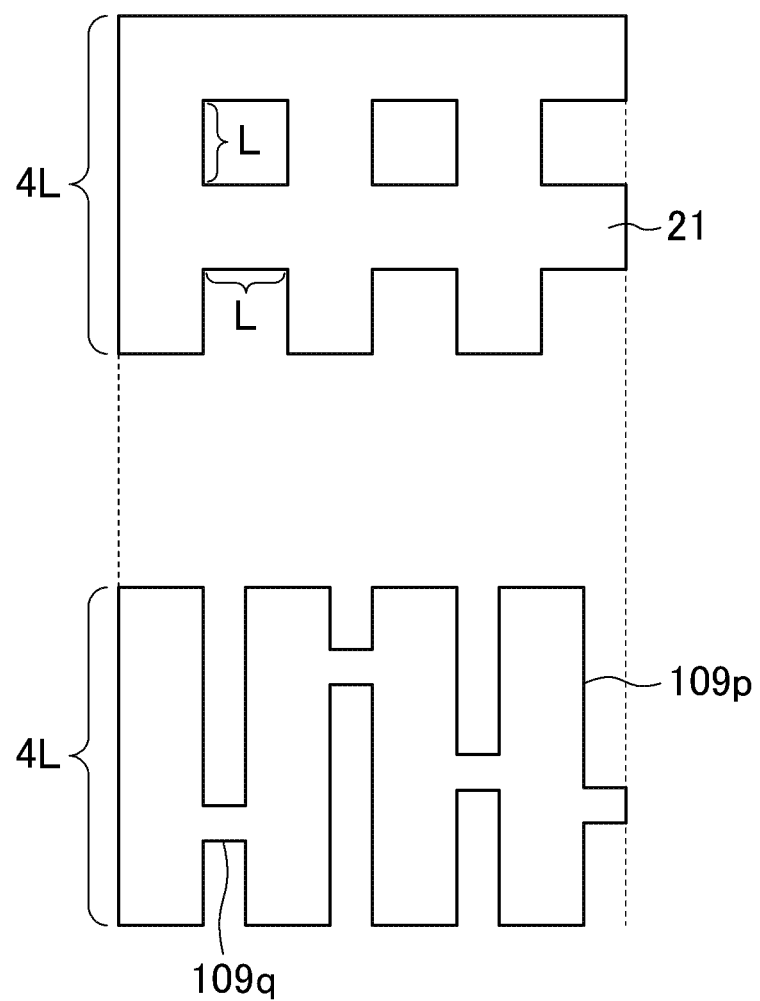
FIG. 9 is a view illustrating advantages of the semiconductor device of the first embodiment.

FIG. 9 shows, for comparison, planar configurations of the conventional pad structure (bonding pad 21) in a lattice shape made of strips having the same width and the pad structure in this embodiment made of a plurality of stripe-shaped pad interconnects 109p. Assume herein that the line width and line spacing of the lattice-shaped bonding pad 21 and the width of the pad interconnects 109p are L and that the pad structures are formed to have the same area of interconnects in the respective pad regions having the same area. In this case, as shown in FIG. 9, the pad structure in this embodiment has more sidewalls than the conventional pad structure, and thus is highly stress-resistant. The reason is that, since the sidewalls as the boundaries between the interconnects and the first insulating film in the pad structure have a function of relaxing a stress, the pad structure having more sidewalls can relax more stresses, and thus is highly stress-resistant. In particular, when Cu is used for the pad structure, the pad structure in this embodiment is more advantageous because Cu contracts by heat treatment, etc. after Cu plating.

In execution of wire bonding to the pad, where the metal constituting the pad and the metal constituting the wire are bonded together by ultrasonic wave, etc., the pad structure in this embodiment exhibits a better bonding property than the conventional lattice-shaped pad structure when compared using the same bonding area. The reason for this improvement in bonding property is also that the total length of the sidewalls as the boundaries between the interconnects and the insulating film in the pad structure is larger.

Another advantage of this embodiment is as follows. In the conventional lattice-shaped pad structure, when a probe comes into contact with an interstice of the lattice (i.e., an insulating film portion of the pad) during probing, the probe may wobble, causing an excessive stress applied to the probe, an interconnect portion of the pad, etc. As a result, the pad may possibly break. Conversely, in the pad structure in this embodiment, where the stripe-shaped pad interconnects 109p are arranged, wobbling, etc. are less likely to occur when the probe comes into contact with a gap between pad interconnects 109p. Thus, stress is less likely to be applied to the probe and the pad interconnects 109p.

(Second Embodiment)

A semiconductor device of the second embodiment of the present disclosure will be described with reference to the relevant drawings.

Figure 10A:
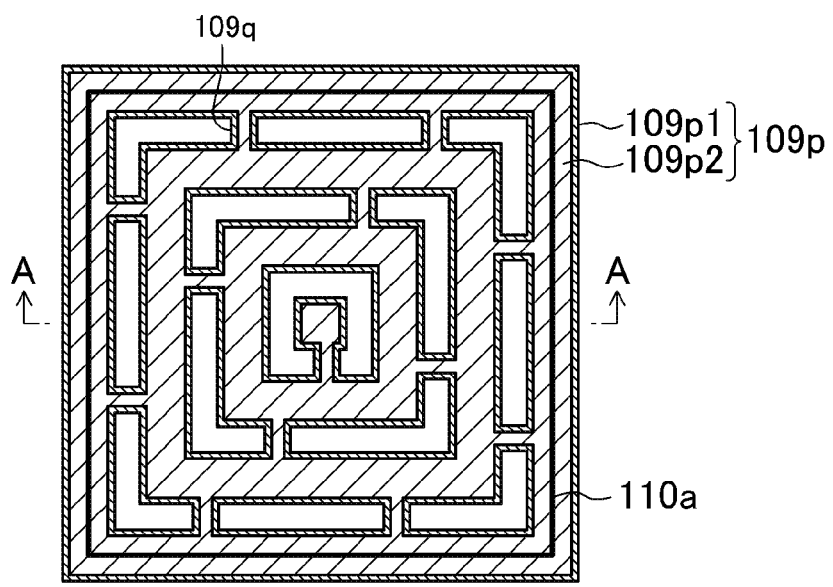
FIG. 10A is a plan view of a semiconductor device of the second embodiment.
Figure 10B:
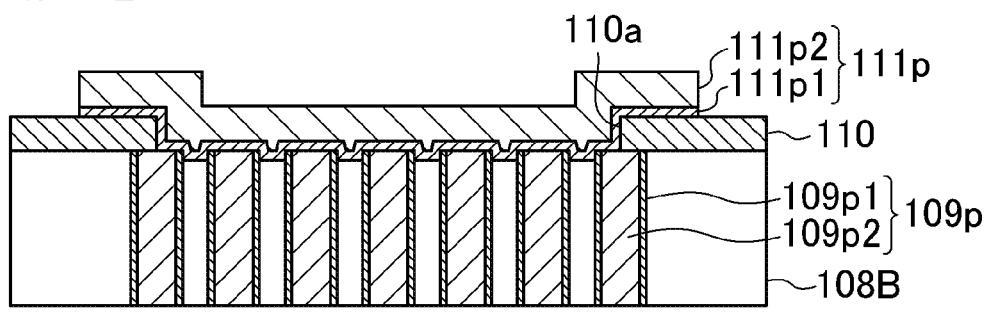
FIG. 10B is a cross-sectional view taken along line A-A in FIG. 10A.

FIG. 10A is a plan view of the semiconductor device of the second embodiment, and FIG. 10B is a cross-sectional view taken along line A-A in FIG. 10A. In FIGS. 10A and 10B, the same components as those in FIGS. 1A and 1B are denoted by the same reference characters, and description of such components is omitted here.

This embodiment is different from the first embodiment in only the layout of a plurality of pad interconnects 109p, and thus only the pad region is shown in FIGS. 10A and 10B. In FIG. 10A, only the pad interconnects 109p (including interconnect links 109q) are shown. In FIG. 10B, illustration of the structure underlying an insulating film 108B in which the pad interconnects 109p (excluding their via portions) are embedded is omitted.

In the first embodiment, as shown in FIG. 1B, a plurality of stripe-shaped pad interconnects 109p are arranged in parallel to run in the same direction. In this embodiment, however, as shown in FIG. 10A, a plurality of pad interconnects 109p in a loop shape (specifically, a square loop shape) are arranged concentrically. The adjacent pad interconnects 109p are electrically connected via the interconnect links 109q. An insulating film 110 made of an SiN film, etc., for example, is formed on the insulating film 108B including the pad interconnects 109p. An opening 110a is formed in the insulating film 110 to expose at least part of the pad constituted by the pad interconnects 109p, and a conductive layer 111p is formed in the opening 110a to be electrically connected to the pad. The conductive layer 111p is also formed on a portion of the insulating film 110 surrounding the opening 110a. The conductive layer 111p includes a barrier metal 111p1 formed to cover the bottom and walls of the opening 110a and an aluminum film 111p2 formed on the barrier metal 111p1. The barrier metal 111p1 has a layered structure of a TiN film and a Ti film, for example.

In this embodiment, the following advantages can be obtained in addition to the advantages described in the first embodiment. That is, with the concentric arrangement of the plurality of loop-shaped pad interconnects 109p, the electrical resistance of the entire pad can be reduced, and the directional property of the resistance can be reduced. Moreover, with existence of the loop-shaped outermost pad interconnect 109p, it is possible to draw interconnects from the pad in every direction with low resistance. In other words, in this embodiment, another interconnect may be drawn from the outermost pad interconnect 109p.

In this embodiment, it is preferable that the sidewalls (edges) of the opening 110a of the insulating film 110 stand on a center portion of the outermost pad interconnect 109p in the width direction. By this placement, it is possible to avoid a trouble that an edge of the opening 110a may be deviated slightly from the position on the pad interconnect 109p due to lack of precision in photolithography, etc. and, as a result, a narrow slit that cannot be filled may be formed in a portion of the insulating film 108B between the edge of the opening 110a and the pad interconnect 109p. Thus, processing stability can be improved.

Although arrangement of four loop-shaped pad interconnects 109p (including the pad interconnect 109p in the center of the pad region) is shown in FIGS. 10A and 10B, it is actually possible to arrange about 10 loop-shaped pad interconnects 109p having a width of about 3 μm, for example, for a pad region having a size of about 100 μm□ (100 μm×100 μm), for example.

(Variation of Second Embodiment)

A semiconductor device of a variation of the second embodiment of the present disclosure will be described with reference to the relevant drawings.

Figure 11A:
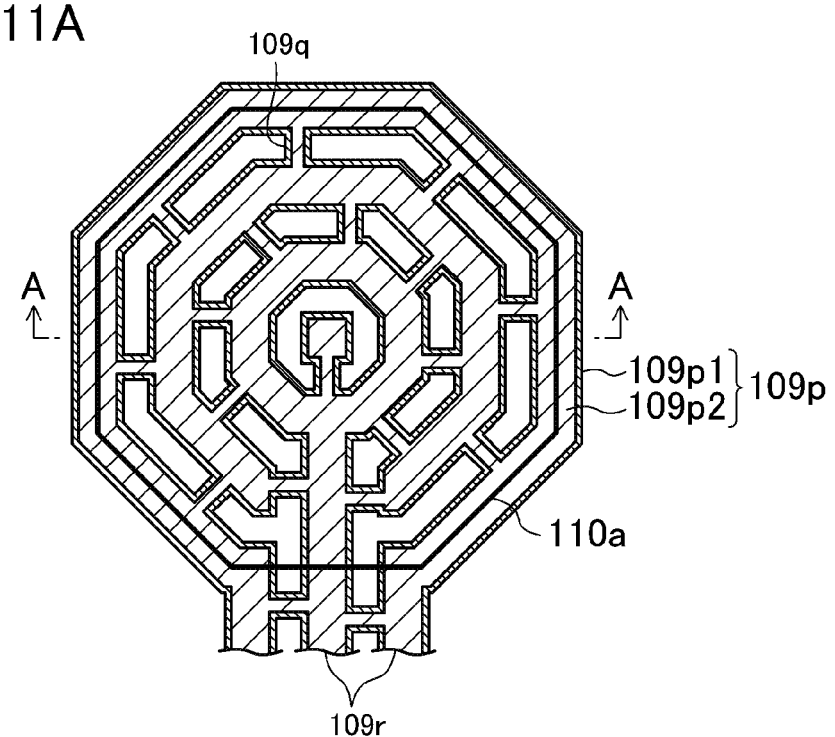
FIG. 11A is a plan view of a semiconductor device of a variation of the second embodiment.
Figure 11B:
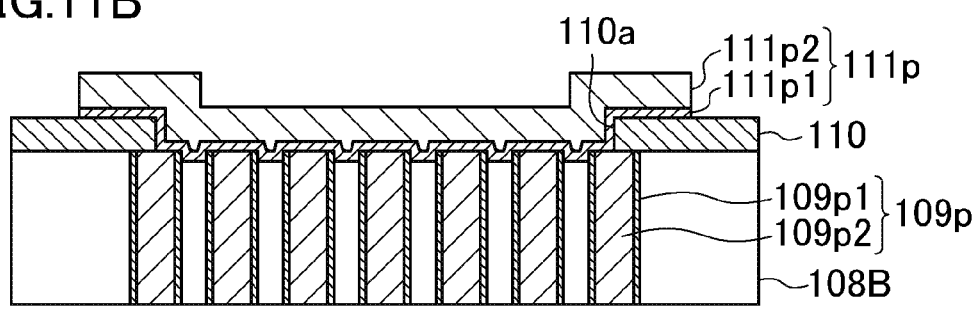
FIG. 11B is a cross-sectional view taken along line A-A in FIG. 11A.

FIG. 11A is a plan view of the semiconductor device of a variation of the second embodiment, and FIG. 11B is a cross-sectional view taken along line A-A in FIG. 11A. In FIGS. 11A and 11B, the same components as those in the first embodiment shown in FIGS. 1A and 1B and the second embodiment shown in FIGS. 10A and 10B are denoted by the same reference characters, and description of such components is omitted here. Note that only the pad region is shown in FIGS. 11A and 11B. In FIG. 11A, only a plurality of pad interconnects 109p (including interconnect links 109q) are shown. In FIG. 11B, illustration of the structure underlying an insulating film 108B in which the pad interconnects 109p (excluding their via portions) are embedded is omitted.

This variation is different from the second embodiment in that, as shown in FIG. 11A, a plurality of pad interconnects 109p in an octagonal loop shape are arranged concentrically. The adjacent pad interconnects 109p are electrically connected to each other via the interconnect links 109q. An insulating film 110 made of an SiN film, etc., for example, is formed on the insulating film 108B including the pad interconnects 109p. An opening 110a is formed in the insulating film 110 to expose at least part of the pad constituted by the pad interconnects 109p, and a conductive layer 111p is formed in the opening 110a to be electrically connected to the pad. The conductive layer 111p is also formed on a portion of the insulating film 110 surrounding the opening 110a. The conductive layer 111p includes a barrier metal 111p1 formed to cover the bottom and walls of the opening 110a and an aluminum film 111p2 formed on the barrier metal 111p1. The barrier metal 111p1 has a layered structure of a TiN film and a Ti film, for example.

In this variation, lead interconnects 109r are drawn out from the outermost pad interconnect 109p and the third-outermost pad interconnect 109p to run outside the pad region in the same direction.

In this variation, the following advantages can be obtained in addition to the advantages described in the first and second embodiments. That is, while the pad interconnects 109p in the second embodiment are in a square loop shape, those in this variation are in an octagonal loop shape that is closer to a circle, and thus the bending of the pad interconnects is milder (45 degrees in an octagon while 90 degrees in a square). Therefore, the filling property of the pad interconnect grooves with the conductive film at their bends (by plating, for example) improves, permitting stable formation of the pad interconnects. Moreover, compared with the square loop-shaped pad interconnects 109p as in the second embodiment, the pad interconnects 109p having about the same area can be arranged in a smaller pad region. Specifically, the area of the octagonal pad region in this variation is equal to the area obtained by subtracting the area of portions of the four corners of the square pad region in the second embodiment from the area of the square pad region. The area of the unused portions can be used for the circuit region, for example.

Although the pad interconnects 109p are in an octagonal loop shape in this variation, the shape is not limited to this, but the pad interconnects 109p may be in a polygonal loop shape having five or more sides or in a circular loop shape. In such a case, also, similar advantages to those in this variation can be obtained.

In this variation, it is preferable that the sidewalls (edges) of the opening 110a of the insulating film 110 stand on a center portion of the outermost pad interconnect 109p in the width direction. By this arrangement, it is possible to avoid a trouble that an edge of the opening 110a may be deviated slightly from the position on the pad interconnect 109p due to lack of precision in photolithography, etc. and, as a result, a narrow slit that cannot be filled may be formed in a portion of the insulating film 108B between the edge of the opening 110a and the pad interconnect 109p. Thus, processing stability can be improved.

Although arrangement of four octagonal loop-shaped pad interconnects 109p (including the pad interconnect 109p in the center of the pad region) is shown in FIGS. 11A and 11B, it is actually possible to arrange about 10 loop-shaped pad interconnects 109p having a width of about 3 μm, for example, for a pad region having a size of about 100 μm□ (100 μm×100 μm), for example.

(Third Embodiment)

A semiconductor device of the third embodiment of the present disclosure will be described with reference to the relevant drawings.

Figure 12A:
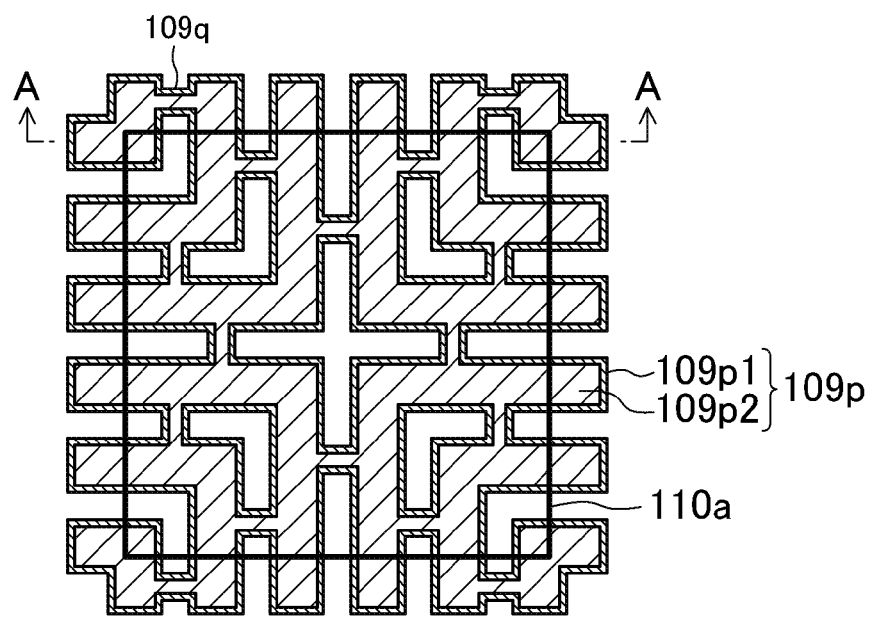
FIG. 12A is a plan view of a semiconductor device of the third embodiment.
Figure 12B:
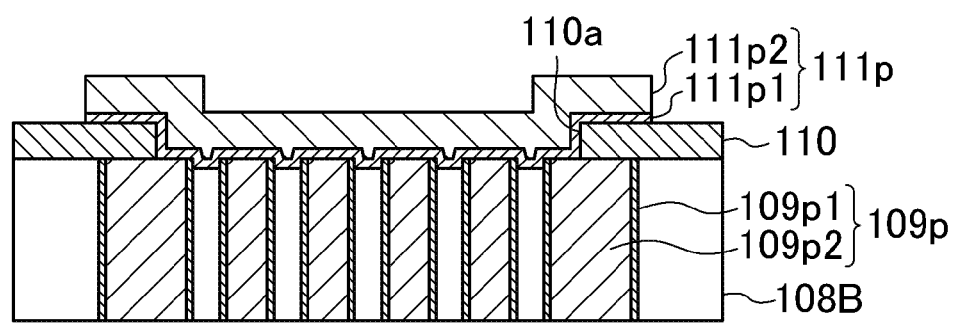
FIG. 12B is a cross-sectional view taken along line A-A in FIG. 12A.
Figure 13A:
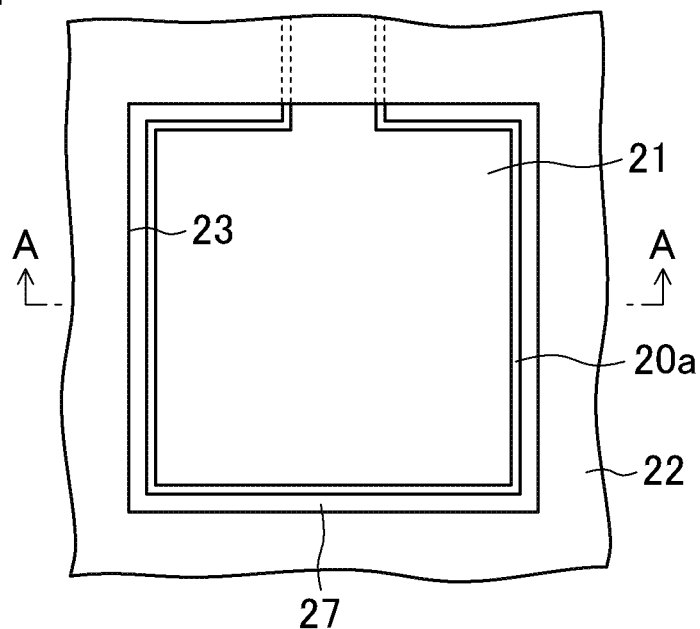
FIG. 13A is a plan view of a semiconductor device of the first conventional example.
Figure 13B:
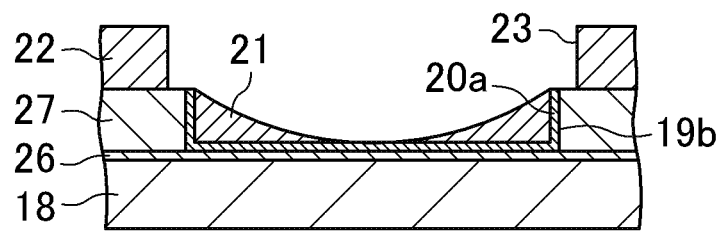
FIG. 13B is a cross-sectional view taken along line A-A in FIG. 13A.
Figure 14A:
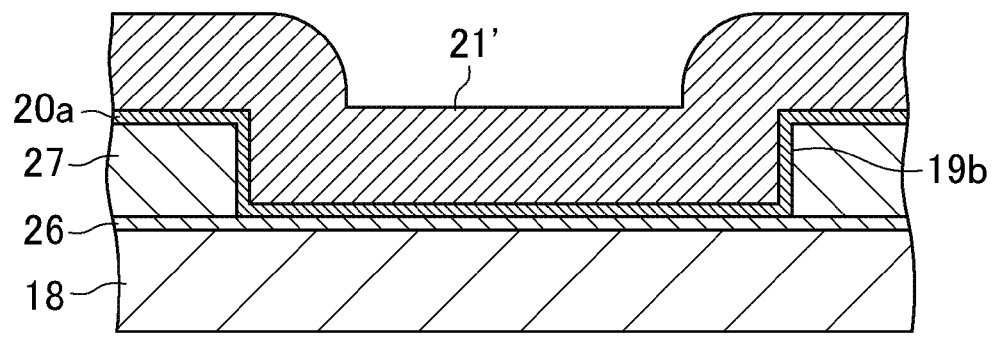
FIGS. 14A and 14B are views illustrating how dishing occurs in the semiconductor device of the first conventional example.
Figure 14B:
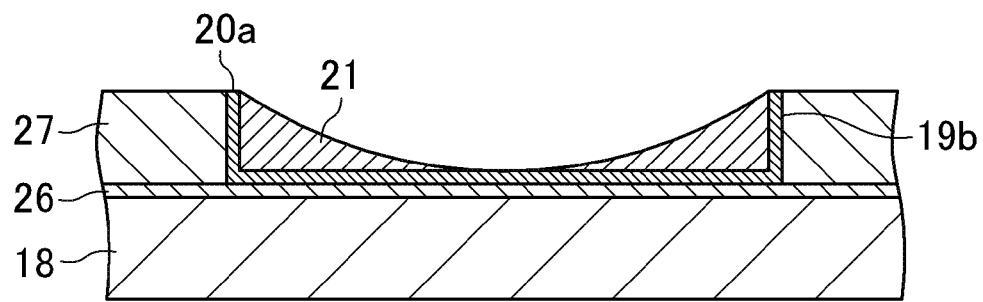
Figure 15A:
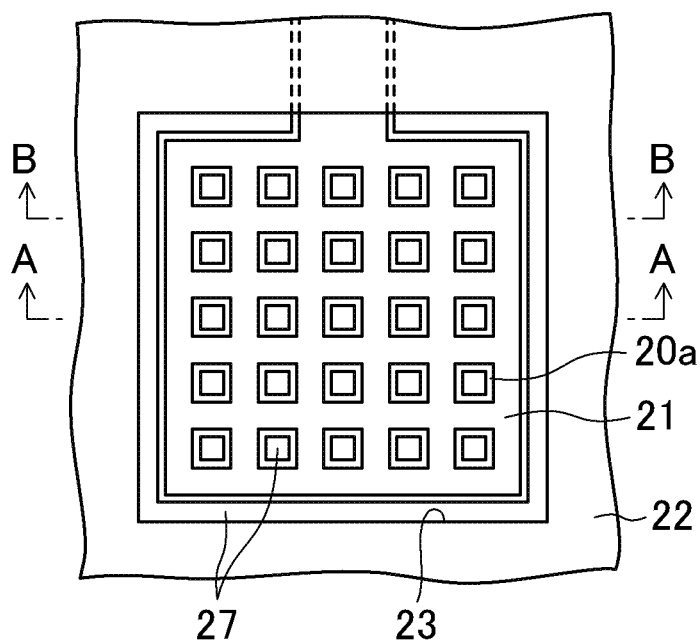
FIG. 15A is a plan view of a semiconductor device of the second conventional example.
Figure 15B:
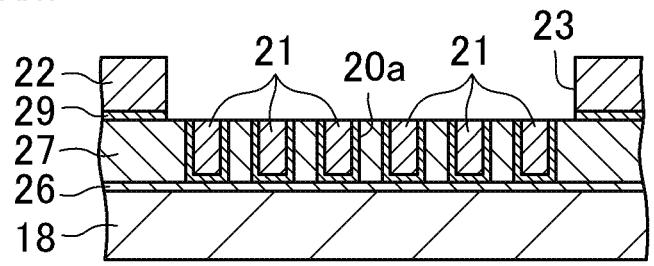
FIG. 15B is a cross-sectional view taken along line A-A in FIG. 15A.
Figure 16A:
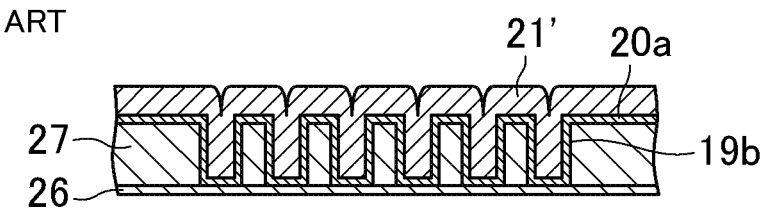
FIGS. 16A and 16B are views illustrating a problem of the second conventional example.
Figure 16B:
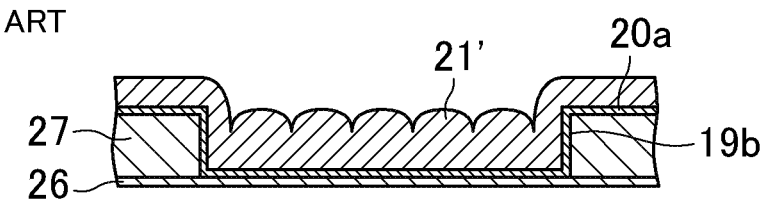

FIG. 12A is a plan view of the semiconductor device of the third embodiment, and FIG. 12B is a cross-sectional view taken along line A-A in FIG. 12A. In FIGS. 12A and 12B, the same components as those in FIGS. 1A and 1B are denoted by the same reference characters, and description of such components is omitted here.

This embodiment is different from the first embodiment in only the layout of a plurality of pad interconnects 109p, and thus only the pad region is shown in FIGS. 12A and 12B. In FIG. 12A, only a plurality of pad interconnects 109p (including interconnect links 109q) are shown. In FIG. 12B, illustration of the structure underlying an insulating film 108B in which the pad interconnects 109p (excluding their via portions) are embedded is omitted.

In the first embodiment, as shown in FIG. 1B, a plurality of stripe-shaped pad interconnects 109p are arranged in parallel to run in the same direction. In this embodiment, however, as shown in FIG. 12A, the pad region is divided into four sub-regions by two straight lines intersecting at right angles at the center of the pad region. In each of the sub-regions, L-shaped interconnects, each having a corner at a position closer to the center of the pad region and running from the corner toward the outside of the pad region in two directions (along the above two straight lines intersecting at right angles), are arranged as a plurality of pad interconnects 109p. The adjacent pad interconnects 109p are electrically connected via the interconnect links 109q. An insulating film 110 made of an SiN film, etc., for example, is formed on the insulating film 108B including the pad interconnects 109p. An opening 110a is formed in the insulating film 110 to expose at least part of the pad constituted by the pad interconnects 109p, and a conductive layer 111p is formed in the opening 110a to be electrically connected to the pad. The conductive layer 111p is also formed on a portion of the insulating film 110 surrounding the opening 110a. The conductive layer 111p includes a barrier metal 111p1 formed to cover the bottom and walls of the opening 110a and an aluminum film 111p2 formed on the barrier metal 111p1. The barrier metal 111p1 has a layered structure of a TiN film and a Ti film, for example.

In this embodiment, the following advantage can be obtained in addition to the advantages described in the first embodiment. That is, lead interconnects can be connected to the pad interconnects 109p from outside the pad region without the necessity of providing bends. Thus, since the width of the lead interconnects can be about the same as the width of the pad interconnects 109p, the resistance of the lead interconnects can be reduced.

Although arrangement of three L-shaped pad interconnects 109p in each of the four sub-regions obtained by dividing the pad region by two straight lines intersecting at right angles is shown in FIGS. 12A and 12B, it is actually possible to arrange about 10 L-shaped pad interconnects 109p having a width of about 3 μm, for example, for each of the four sub-regions of the pad region having a size of about 100 μm□ (100 μm×100 μm), for example.

In this embodiment, the pad interconnects 109p each having two lines intersecting at about 90 degrees at its corner are formed. Alternatively, it is possible to form pad interconnects 109p each having two lines intersecting at an angle larger than 90 degrees, e.g., about 135 degrees, at its corner. By this arrangement, the filling property of the pad interconnect grooves with the conductive film at their bends (by plating, for example) improves, permitting stable formation of the pad interconnects.

What is claimed is:

1. A semiconductor device, comprising:
a first insulating film formed on a substrate;
a pad embedded in the first insulating film; and
a second insulating film formed on the first insulating film, the second insulating film having an opening exposing at least part of the pad, wherein
the pad includes a plurality of pad interconnects,
two interconnect links are provided to electrically connect adjacent interconnects among the plurality of pad interconnects, the adjacent interconnects being arranged in a direction parallel to an upper surface of the substrate,
each of top surfaces of the adjacent interconnects and each of top surfaces of the two interconnect links are exposed from the first insulating film,
a width of each of the plurality of pad interconnects is smaller than a height of the plurality of pad interconnects and larger than a width of each of the two interconnect links, and
a spacing between the two interconnect links is two times or more as large as the width of the plurality of pad interconnects.

2. The semiconductor device of claim 1, wherein the height of the plurality of pad interconnects is 1.5 times to 5 times as large as the width of the plurality of pad interconnects.

3. The semiconductor device of claim 1, wherein the width of each of the two interconnect links is three quarters or less of the width of the plurality of pad interconnects.

4. The semiconductor device of claim 1, wherein a spacing between the plurality of pad interconnects is smaller than the width of the plurality of pad interconnects.

5. The semiconductor device of claim 4, wherein the spacing between the plurality of pad interconnects is three quarters or less of the width of the plurality of pad interconnects.

6. The semiconductor device of claim 1, wherein a top surface of a portion of the first insulating film located in the opening is at a level lower than the top surfaces of the adjacent interconnects.

7. The semiconductor device of claim 6, wherein the top surface of a portion of the first insulating film located in the opening is at a level lower than the top surface of a portion of the first insulating film located outside the opening.

8. The semiconductor device of claim 1, wherein at least part of sidewalls of the opening stands on a center portion of one or more interconnects, among the plurality of pad interconnects, in the width direction.

9. The semiconductor device of claim 1, wherein a conductive layer is formed in the opening so as to be electrically connected to the part of the pad.

10. The semiconductor device of claim 9, wherein the conductive layer is also formed on a portion of the second insulating film surrounding the opening.

11. The semiconductor device of claim 1, further comprising:
a circuit interconnect embedded in the first insulating film, and
a width of the circuit interconnect is smaller than a height of the circuit interconnect.

12. The semiconductor device of claim 11, wherein the pad and the circuit interconnect are electrically connected to each other via another interconnect formed below the first insulating film.

13. The semiconductor device of claim 11, wherein the pad and the circuit interconnect are electrically connected to each other by extending at least some of the plurality of pad interconnects to be connected to the circuit interconnect.

14. The semiconductor device of claim 1, wherein the plurality of pad interconnects each have a stripe shape.

15. The semiconductor device of claim 1, wherein the plurality of pad interconnects each have a loop shape and are arranged concentrically.

16. The semiconductor device of claim 15, wherein another interconnect is drawn from an outermost interconnect among the plurality of pad interconnects.

17. The semiconductor device of claim 15, wherein the loop shape is an octagonal or circular loop shape.

18. The semiconductor device of claim 1, wherein the plurality of pad interconnects each have a corner at a position closer to the center of the opening and run from the corner toward the outside of the opening in two directions.

19. The semiconductor device of claim 1, wherein each of bottom surfaces of the adjacent interconnects and each of bottom surfaces of the two interconnect links are at a same level.

20. The semiconductor device of claim 1, wherein each of top surfaces of the adjacent interconnects are at a same level.

21. A semiconductor device, comprising:
a first insulating film formed on a substrate;
a pad embedded in the first insulating film; and
a second insulating film formed on the first insulating film, the second insulating film having an opening exposing at least part of the pad, wherein
the pad includes a plurality of pad interconnects,
two interconnect links are provided to electrically connect adjacent interconnects among the plurality of pad interconnects the adjacent interconnects being arranged in a direction parallel to an upper surface of the substrate,
each of top surfaces of the adjacent interconnects and each of top surfaces of the two interconnect links are exposed from the first insulating film,
a width of each of the plurality of pad interconnects is smaller than a height of the plurality of pad interconnects and larger than a width of each of the two interconnect links, and
when one of the two interconnect links is provided between the adjacent interconnects at a position of one side of each of the interconnects, another of the two interconnect links is not provided at a position of the other side of the interconnect opposite to the position of the one interconnect link.

* * * * *